(12) United States Patent
Merriman et al.

(10) Patent No.: US 8,846,240 B2
(45) Date of Patent: Sep. 30, 2014

(54) BATTERY CELL INTERCONNECT AND VOLTAGE SENSING ASSEMBLY AND METHOD OF MANUFACTURING THE ASSEMBLY

(75) Inventors: Robert Merriman, Shelby Township, MI (US); Bryan Symons, Westland, MI (US)

(73) Assignee: LG Chem, Ltd., Seoul (KR)

( * ) Notice: Subject to any disclaimer, the term of this patent is extended or adjusted under 35 U.S.C. 154(b) by 360 days.

(21) Appl. No.: 13/397,782

(22) Filed: Feb. 16, 2012

(65) Prior Publication Data

US 2013/0216878 A1 Aug. 22, 2013

(51) Int. Cl.
*H01M 2/26* (2006.01)

(52) U.S. Cl.
USPC ........... 429/161; 429/155; 429/158; 429/156; 429/160

(58) Field of Classification Search
USPC .......................... 429/161, 155, 158, 156, 160
See application file for complete search history.

(56) References Cited

U.S. PATENT DOCUMENTS

| | | | |
|---|---|---|---|
| 4,409,304 A | 10/1983 | Gerard et al. | |
| 5,503,948 A | 4/1996 | MacKay et al. | |
| 5,639,571 A | 6/1997 | Waters et al. | |
| 5,856,041 A | 1/1999 | Inoue et al. | |
| 6,023,146 A | 2/2000 | Casale et al. | |
| 6,261,719 B1 | 7/2001 | Ikeda et al. | |
| 6,521,363 B1 | 2/2003 | Yeh | |
| 6,555,264 B1 | 4/2003 | Hamada et al. | |
| 6,773,301 B1 | 8/2004 | Chaskin | |
| 7,229,327 B2 | 6/2007 | Zhao et al. | |
| 7,270,576 B2 | 9/2007 | Kim et al. | |
| 7,270,912 B2 | 9/2007 | Oogami | |
| 7,294,020 B2 | 11/2007 | Zhao et al. | |
| 7,507,124 B2 | 3/2009 | Kim | |
| 7,563,137 B1 | 7/2009 | Koetting et al. | |
| 7,578,702 B1 | 8/2009 | Tom et al. | |
| 7,642,746 B2 | 1/2010 | Kim et al. | |
| 7,762,848 B2 | 7/2010 | Koetting et al. | |
| 8,035,986 B2 | 10/2011 | Koetting et al. | |
| 2001/0049055 A1 | 12/2001 | Saito | |

(Continued)

FOREIGN PATENT DOCUMENTS

| | | |
|---|---|---|
| EP | 1089373 A1 | 4/2001 |
| GB | 2084390 A | 4/1982 |

(Continued)

OTHER PUBLICATIONS

International Search Report for International Patent Application No. PCT/KR2009/003438 dated Jan. 22, 2010.

(Continued)

*Primary Examiner* — Jane Rhee
(74) *Attorney, Agent, or Firm* — Buckert Patent & Trademark Law Firm, P.C.; John F. Buckert

(57) ABSTRACT

A battery cell interconnect and voltage sensing assembly and method are provided. The assembly includes a frame member having a rectangular ring-shaped peripheral wall with first, second, third and fourth wall portions. The frame member further includes a central plate portion. The assembly further includes an electrical interconnect member electrically that is coupled to an electrical terminal of a battery cell. The electrical interconnect member has a tab that extends through an aperture in the central plate portion. The assembly further includes a circuit board and an encapsulation portion that is bonded to and covers a side of the circuit board.

13 Claims, 20 Drawing Sheets

(56) References Cited

U.S. PATENT DOCUMENTS

| | | |
|---|---|---|
| 2003/0027039 A1 | 2/2003 | Benson et al. |
| 2003/0213121 A1 | 11/2003 | Rouillard et al. |
| 2004/0043663 A1 | 3/2004 | Ikeda et al. |
| 2005/0031945 A1 | 2/2005 | Morita et al. |
| 2005/0130033 A1 | 6/2005 | Iwamura et al. |
| 2006/0127754 A1 | 6/2006 | Hamada et al. |
| 2006/0177733 A1 | 8/2006 | Ha et al. |
| 2006/0194101 A1 | 8/2006 | Ha et al. |
| 2006/0234558 A1 | 10/2006 | Li |
| 2007/0238018 A1 | 10/2007 | Lee et al. |
| 2008/0124617 A1 | 5/2008 | Bjork |
| 2008/0169788 A1 | 7/2008 | Bobbin et al. |
| 2008/0254356 A1 | 10/2008 | Liersch et al. |
| 2009/0139781 A1 | 6/2009 | Straubel |
| 2009/0325042 A1 | 12/2009 | Koetting et al. |
| 2010/0062329 A1 | 3/2010 | Muis |
| 2011/0293994 A1 | 12/2011 | Casoli |
| 2012/0088140 A1 | 4/2012 | Kardasz et al. |
| 2013/0029204 A1 | 1/2013 | Khakhalev et al. |
| 2013/0052503 A1 | 2/2013 | Payne |
| 2013/0052511 A1 | 2/2013 | Khakhalev |
| 2013/0216878 A1 | 8/2013 | Merriman et al. |

FOREIGN PATENT DOCUMENTS

| | | |
|---|---|---|
| JP | 2000123802 A | 4/2000 |
| JP | 2000164200 A | 6/2000 |
| JP | 2002252036 A | 9/2002 |
| JP | 2003282044 A | 10/2003 |
| JP | 2004178860 A | 6/2004 |
| KP | KR20080027504 A | 3/2008 |
| KR | 20020064366 A | 8/2002 |
| KR | 20070057662 A | 6/2007 |
| KR | 20070100555 A | 10/2007 |
| KR | 20080027505 A | 3/2008 |
| KR | 20080036258 A | 4/2008 |
| KR | 20090095949 A | 9/2008 |
| KR | 100996957 B | 1/2010 |
| KR | 101042611 B | 1/2010 |
| KR | 20100003146 A | 1/2010 |
| KR | 101050318 B | 10/2010 |
| WO | WO0030190 | 5/2000 |

OTHER PUBLICATIONS

International Search Report for International Patent Application No. PCT/KR2009/003440 dated Jan. 22, 2010.

U.S. Appl. No. 13/931,169, filed Jul. 28, 2011 entitled "Battery Modules Having Interconnect Members With Vibration Dampening Portions".

U.S. Appl. No. 13/222,492, filed Aug. 31, 2011 entitled "Interconnection Assemblies and Methods for Forming the Interconnection Assemblies in a Battery Module".

U.S. Appl. No. 61/528,963, filed Aug. 30, 2011 entitled "Battery System and Method for Coupling a Battery Cell Assembly to an Electrically Non-Conductive Base Member".

International Search Report for International application No. PCT/KR2012/006813 dated Feb. 14, 2013.

International Search Report for International application No. PCT/KR2013/001174 dated May 13, 2013.

```
┌─────────────────────────────────────────────────────────────────┐
│ USER PROVIDES A FRAME MEMBER HAVING A FIRST SIDE AND A SECOND SIDE, THE FRAME MEMBER FURTHER │
│ HAVING A GENERALLY RECTANGULAR RING-SHAPED PERIPHERAL WALL HAVING FIRST, SECOND, THIRD AND │
│ FOURTH WALL PORTIONS, THE FIRST AND SECOND WALL PORTIONS BEING SUBSTANTIALLY PARALLEL TO ONE │
│ ANOTHER AND BEING SPACED APART FROM ONE ANOTHER, THE THIRD AND FOURTH WALL PORTIONS BEING │
│ SUBSTANTIALLY PARALLEL TO ONE ANOTHER AND BEING SPACED APART FROM ONE ANOTHER; THE FRAME │──1260
│ MEMBER FURTHER HAVING A CENTRAL PLATE PORTION COUPLED BETWEEN THE FIRST AND SECOND WALL │
│ PORTIONS, THE CENTRAL PLATE PORTION DEFINING A FIRST SPACE BETWEEN THE CENTRAL PLATE PORTION │
│ AND THE THIRD WALL PORTION, THE CENTRAL PLATE PORTION FURTHER DEFINING A SECOND SPACE │
│ BETWEEN THE CENTRAL PLATE PORTION AND THE FOURTH WALL PORTION; THE FRAME MEMBER FURTHER │
│ HAVING A FIRST SUPPORT MEMBER DISPOSED BETWEEN THE THIRD WALL PORTION AND THE CENTRAL │
│ PLATE PORTION SUCH THAT FIRST AND SECOND GAPS ARE FORMED ADJACENT TO OPPOSITE EDGES OF THE │
│ FIRST SUPPORT MEMBER, THE FRAME MEMBER FURTHER INCLUDES A SECOND SUPPORT MEMBER │
│ DISPOSED BETWEEN THE FOURTH WALL PORTION AND THE CENTRAL PLATE PORTION SUCH THAT THIRD AND │
│ FOURTH GAPS ARE FORMED ADJACENT TO OPPOSITE EDGES OF THE SECOND SUPPORT MEMBER │
└─────────────────────────────────────────────────────────────────┘
                                        ↓
┌─────────────────────────────────────────────────────────────────┐
│ USER DISPOSES A CIRCUIT BOARD PROXIMATE TO THE SECOND SIDE OF THE FRAME MEMBER ON AT │
│ LEAST ONE COUPLING TAB EXTENDING FROM THE CENTRAL PLATE PORTION, THE CIRCUIT BOARD HAVING │
│ FIRST AND SECOND SIDES, THE FIRST SIDE OF THE CIRCUIT BOARD BEING DISPOSED PROXIMATE TO THE │──1262
│ CENTRAL PLATE PORTION, AND THE SECOND SIDE OF THE CIRCUIT BOARD BEING DISPOSED OPPOSITE TO │
│ THE FIRST SIDE OF THE CIRCUIT BOARD, AN ELECTRICAL CONNECTOR BEING DISPOSED ON THE CIRCUIT │
│ BOARD THAT EXTENDS THROUGH A FIRST APERTURE OF THE CENTRAL PLATE PORTION, THE CIRCUIT BOARD │
│ HAVING FIRST AND SECOND ELECTRICAL TRACES │
└─────────────────────────────────────────────────────────────────┘
                                        ↓
┌─────────────────────────────────────────────────────────────────┐
│ HEAT STAKING DEVICE COUPLES A FIRST ELECTRICAL INTERCONNECT MEMBER TO THE FIRST SUPPORT │
│ MEMBER ON THE FIRST SIDE OF THE FRAME MEMBER, THE FIRST ELECTRICAL INTERCONNECT MEMBER │──1264
│ HAVING A FIRST VOLTAGE SENSING TAB THAT EXTENDS THROUGH A SECOND APERTURE IN THE CENTRAL │
│ PLATE PORTION │
└─────────────────────────────────────────────────────────────────┘
                                        ↓
                                       (A)

FIG. 18
```

BATTERY CELL INTERCONNECT AND VOLTAGE SENSING ASSEMBLY AND METHOD OF MANUFACTURING THE ASSEMBLY

BACKGROUND

The inventors herein have recognized a need for an improved battery cell interconnnect and voltage sensing assembly and method for manufacturing the assembly.

SUMMARY

A battery cell interconnect and voltage sensing assembly in accordance with an exemplary embodiment is provided. The assembly includes a frame member having a first side and a second side. The frame member further includes a generally rectangular ring-shaped peripheral wall having first, second, third and fourth wall portions. The first and second wall portions are substantially parallel to one another and are spaced apart from one another. The third and fourth wall portions are substantially parallel to one another and are spaced apart from one another. The frame member further includes a central plate portion coupled between the first and second wall portions. The central plate portion defines a first space between the central plate portion and the third wall portion. The central plate portion further defines a second space between the central plate portion and the fourth wall portion. The frame member further includes a first support member disposed between the third wall portion and the central plate portion such that first and second gaps are formed adjacent to opposite edges of the first support member. The assembly further includes a first electrical interconnect member coupled to the first support member on the first side of the frame member. The first electrical interconnect member is configured to be electrically coupled to a first electrical terminal of a first battery cell extending through the first gap. The first electrical interconnect member has a first voltage sensing tab that extends through a first aperture in the central plate portion. The assembly further includes a circuit board disposed proximate to the second side of the frame member on at least one coupling tab extending from the central plate portion. The circuit board has first and second sides. The first side of the circuit board is disposed proximate to the central plate portion and the second side of the circuit board is disposed opposite to the first side of the circuit board. The assembly further includes an electrical connector disposed on the circuit board and extending through a second aperture of the central plate portion. The circuit board has a first electrical trace coupled between the first voltage sensing tab and the electrical connector. The assembly further includes an encapsulation portion that is bonded to and covers the second side of the circuit board.

A method for manufacturing a battery cell interconnect and voltage sensing assembly in accordance with another exemplary embodiment is provided. The method includes providing a frame member having a first side and a second side. The frame member further includes a generally rectangular ring-shaped peripheral wall having first, second, third and fourth wall portions. The first and second wall portions are substantially parallel to one another and are spaced apart from one another. The third and fourth wall portions are substantially parallel to one another and are spaced apart from one another. The frame member further includes a central plate portion coupled between the first and second wall portions. The central plate portion defines a first space between the central plate portion and the third wall portion. The central plate portion further defines a second space between the central plate portion and the fourth wall portion. The frame member further includes a first support member disposed between the third wall portion and the central plate portion such that first and second gaps are formed adjacent to opposite edges of the first support member. The method further includes disposing a circuit board proximate to the second side of the frame member on at least one coupling tab extending from the central plate portion. The circuit board has first and second sides. The first side of the circuit board is disposed proximate to the central plate portion and the second side of the circuit board is disposed opposite to the first side of the circuit board. An electrical connector is disposed on the circuit board that extends through a second aperture of the central plate portion. The circuit board has a first electrical trace. The method further includes coupling a first electrical interconnect member to the first support member on the first side of the frame member. The first electrical interconnect member has a first voltage sensing tab that extends through a first aperture in the central plate portion. The method further includes soldering the first voltage sensing tab to the first electrical trace on the circuit board. The first electrical trace extends between the first voltage sensing tab and the electrical connector. The method further includes applying an encapsulation portion to the second side of the circuit board that bonds to and covers the second side of the circuit board.

BRIEF DESCRIPTION OF THE DRAWINGS

FIGS. 18-19 are flowcharts of a method for manufacturing the battery cell interconnect and voltage sensing assembly of FIG. 15 in accordance with another exemplary embodiment.

DETAILED DESCRIPTION

Figure 1:
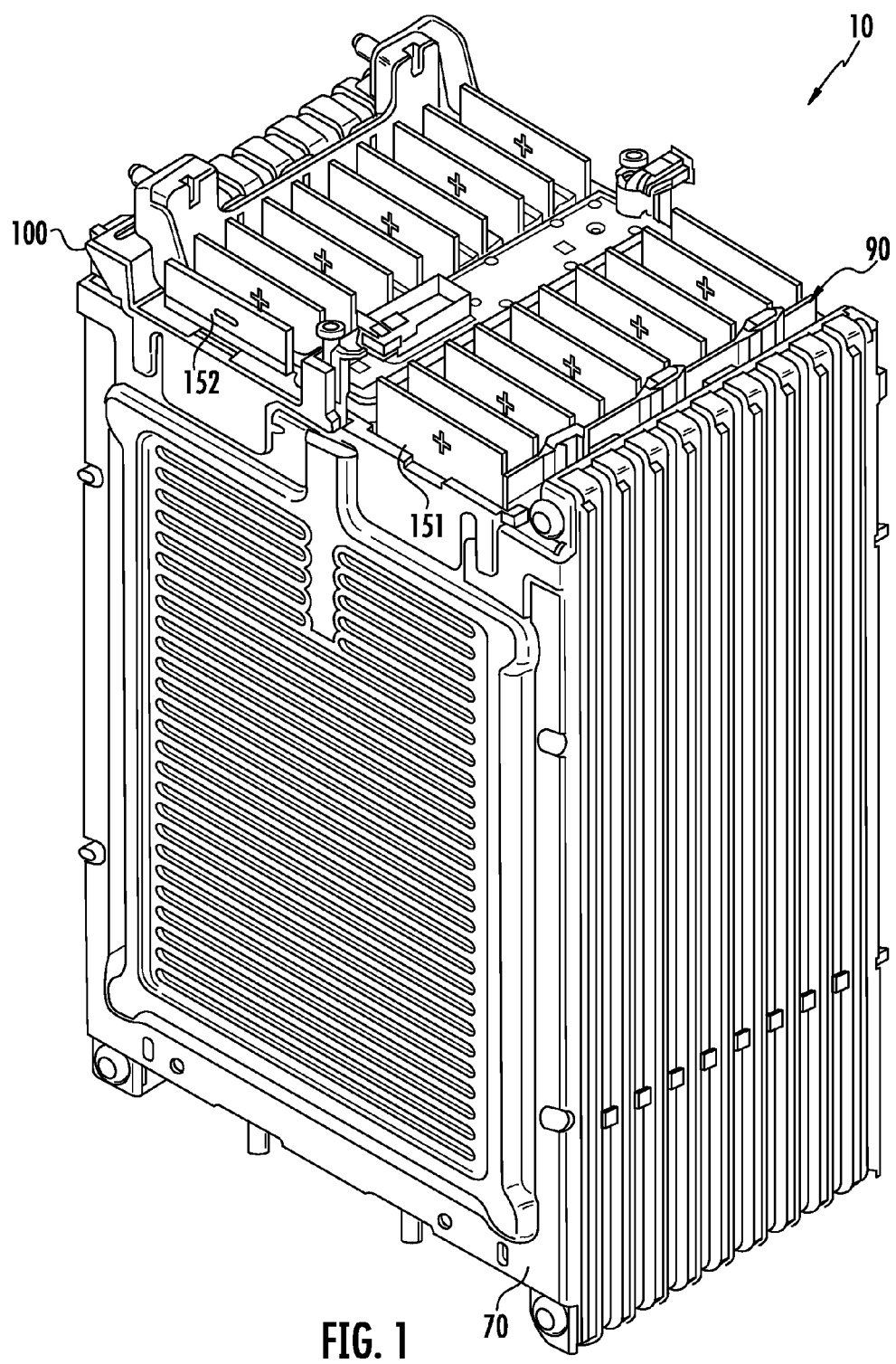
FIG. 1 is a schematic of a vehicle battery module having a battery cell interconnect and voltage sensing assembly in accordance with an exemplary embodiment.
Figure 2:
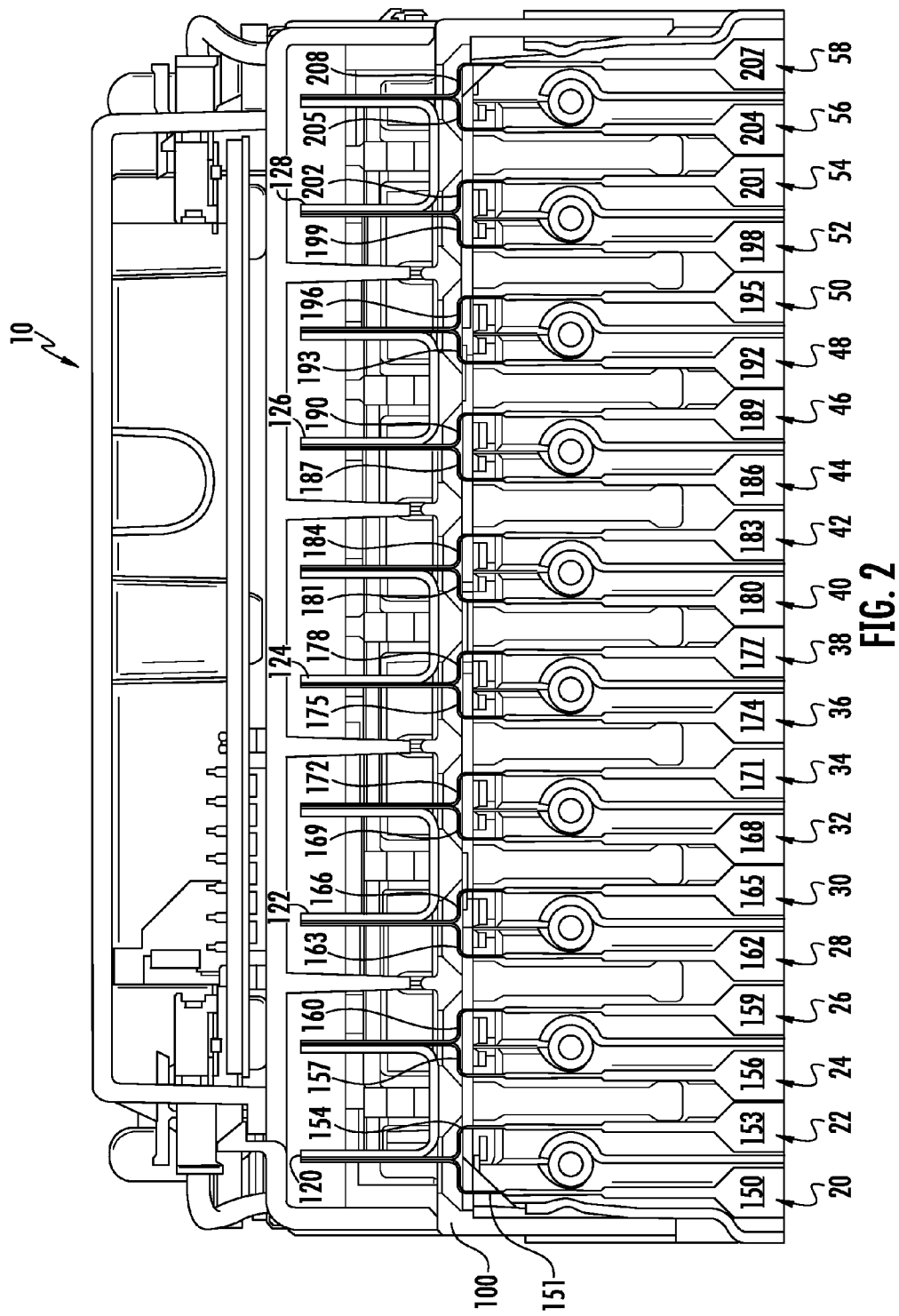
FIG. 2 is a cross-sectional schematic of a portion of the vehicle battery module of FIG. 1.
Figure 3:
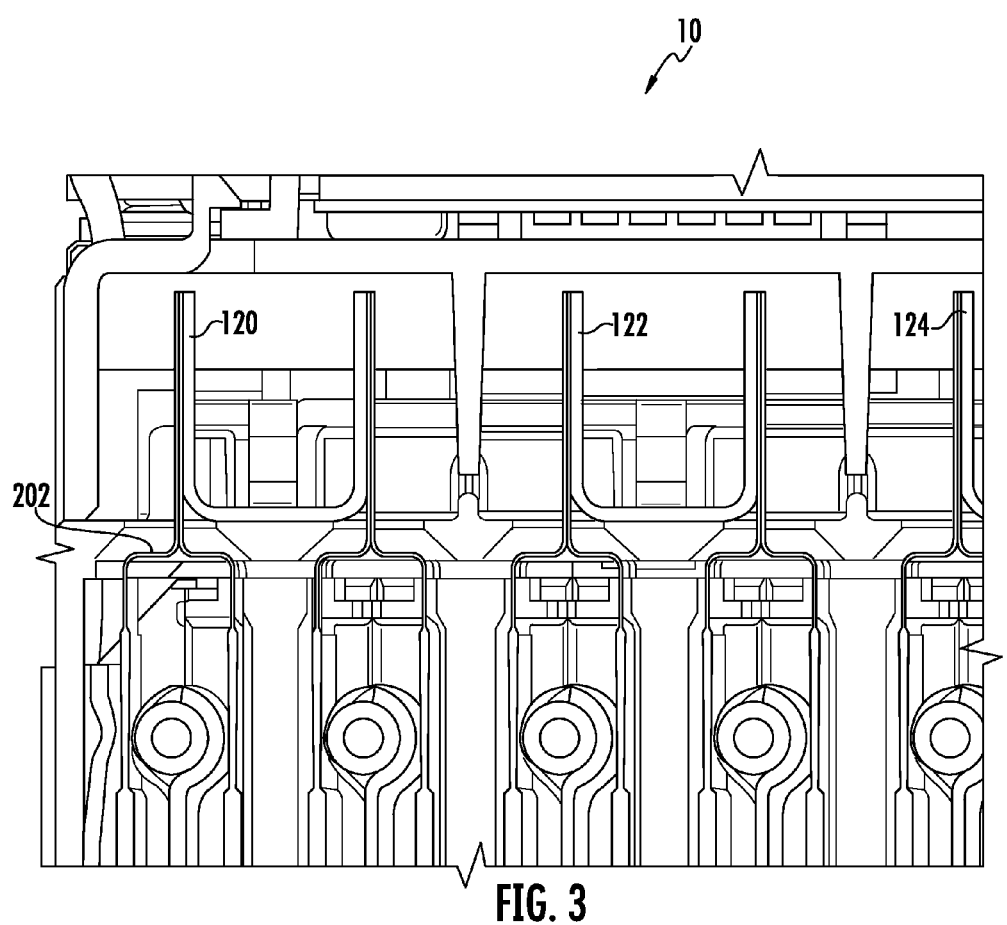
FIG. 3 is an enlarged schematic of a portion of FIG. 2.

Referring to FIGS. 1-3, a vehicle battery module 10 in accordance with an exemplary embodiment is provided. The vehicle battery module 10 includes battery cells 20, 22, 24, 26, 28, 30, 32, 34, 36, 38, 40, 42, 44, 46, 48, 50, 52, 54, 56, 58, a housing 70, and a battery cell interconnect and voltage sensing assembly 90.

The battery cells 20-58 are each configured to generate an operational voltage. In one exemplary embodiment, the battery cells 20-58 are pouch-type lithium-ion battery cells that have a generally rectangular-shaped body portion and a pair of electrical terminals. In one exemplary embodiment, the battery cells 20-58 are electrically coupled in series with one another utilizing the electrical interconnect members 120-140. It should be noted that in an exemplary embodiment, the electrical terminals of the battery cells 20-58 are coupled to corresponding electrical interconnect members by ultrasonically welding the electrical terminals of the battery cells 20-58 to the corresponding electrical interconnect members utilizing an ultrasonic welding machine.

Referring to FIGS. 1, 2, 9 and 20, the battery cell 20 has a rectangular-shaped body portion 150 with an electrical terminal 151 and an electrical terminal 152 extending from the body portion 150. The electrical terminal 151 is coupled to the electrical interconnect member 120 and the electrical terminal 152 is coupled to the electrical interconnect member 130.

The battery cell 22 has a rectangular-shaped body portion 153 with an electrical terminal 154 and an electrical terminal 155 extending from the body portion 153. The electrical terminal 154 is coupled to the electrical interconnect member 120 and the electrical terminal 155 is coupled to the electrical interconnect member 130.

The battery cell 24 has a rectangular-shaped body portion 156 with an electrical terminal 157 and an electrical terminal 158 extending from the body portion 156. The electrical terminal 157 is coupled to the electrical interconnect member 120 and the electrical terminal 158 is coupled to the electrical interconnect member 132.

The battery cell 26 has a rectangular-shaped body portion 159 with an electrical terminal 160 and an electrical terminal 161 extending from the body portion 159. The electrical terminal 160 is coupled to the electrical interconnect member 120 and the electrical terminal 161 is coupled to the electrical interconnect member 132.

The battery cell 28 has a rectangular-shaped body portion 162 with an electrical terminal 163 and an electrical terminal 164 extending from the body portion 162. The electrical terminal 163 is coupled to the electrical interconnect member 122 and the electrical terminal 164 is coupled to the electrical interconnect member 132.

The battery cell 30 has a rectangular-shaped body portion 165 with an electrical terminal 166 and an electrical terminal 167 extending from the body portion 165. The electrical terminal 166 is coupled to the electrical interconnect member 122 and the electrical terminal 167 is coupled to the electrical interconnect member 132.

The battery cell 32 has a rectangular-shaped body portion 168 with an electrical terminal 169 and an electrical terminal 170 extending from the body portion 168. The electrical terminal 169 is coupled to the electrical interconnect member 122 and the electrical terminal 170 is coupled to the electrical interconnect member 134.

The battery cell 34 has a rectangular-shaped body portion 171 with an electrical terminal 172 and an electrical terminal 173 extending from the body portion 171. The electrical terminal 172 is coupled to the electrical interconnect member 122 and the electrical terminal 173 is coupled to the electrical interconnect member 134.

The battery cell 36 has a rectangular-shaped body portion 174 with an electrical terminal 175 and an electrical terminal 176 extending from the body portion 174. The electrical terminal 175 is coupled to the electrical interconnect member 124 and the electrical terminal 176 is coupled to the electrical interconnect member 134.

The battery cell 38 has a rectangular-shaped body portion 177 with an electrical terminal 178 and an electrical terminal 179 extending from the body portion 177. The electrical terminal 178 is coupled to the electrical interconnect member 124 and the electrical terminal 179 is coupled to the electrical interconnect member 134.

The battery cell 40 has a rectangular-shaped body portion 180 with an electrical terminal 181 and an electrical terminal 182 extending from the body portion 180. The electrical terminal 181 is coupled to the electrical interconnect member 124 and the electrical terminal 182 is coupled to the electrical interconnect member 136.

The battery cell 42 has a rectangular-shaped body portion 183 with an electrical terminal 184 and an electrical terminal 185 extending from the body portion 183. The electrical terminal 184 is coupled to the electrical interconnect member 124 and the electrical terminal 185 is coupled to the electrical interconnect member 136.

The battery cell 44 has a rectangular-shaped body portion 186 with an electrical terminal 187 and an electrical terminal 188 extending from the body portion 186. The electrical terminal 187 is coupled to the electrical interconnect member 126 and the electrical terminal 188 is coupled to the electrical interconnect member 136.

The battery cell 46 has a rectangular-shaped body portion 189 with an electrical terminal 190 and an electrical terminal 191 extending from the body portion 189. The electrical terminal 190 is coupled to the electrical interconnect member 126 and the electrical terminal 191 is coupled to the electrical interconnect member 136.

The battery cell 48 has a rectangular-shaped body portion 192 with an electrical terminal 193 and an electrical terminal 194 extending from the body portion 192. The electrical terminal 193 is coupled to the electrical interconnect member 126 and the electrical terminal 194 is coupled to the electrical interconnect member 138.

The battery cell 50 has a rectangular-shaped body portion 195 with an electrical terminal 196 and an electrical terminal 197 extending from the body portion 195. The electrical terminal 196 is coupled to the electrical interconnect member 126 and the electrical terminal 197 is coupled to the electrical interconnect member 138.

The battery cell 52 has a rectangular-shaped body portion 198 with an electrical terminal 199 and an electrical terminal 200 extending from the body portion 198. The electrical terminal 199 is coupled to the electrical interconnect member 128 and the electrical terminal 200 is coupled to the electrical interconnect member 138.

The battery cell 54 has a rectangular-shaped body portion 201 with an electrical terminal 202 and an electrical terminal 203 extending from the body portion 201. The electrical terminal 202 is coupled to the electrical interconnect member 128 and the electrical terminal 203 is coupled to the electrical interconnect member 138.

The battery cell 56 has a rectangular-shaped body portion 204 with an electrical terminal 205 and an electrical terminal 206 extending from the body portion 204. The electrical terminal 205 is coupled to the electrical interconnect member 128 and the electrical terminal 206 is coupled to the electrical interconnect member 140.

The battery cell 58 has a rectangular-shaped body portion 207 with an electrical terminal 208 and an electrical terminal 209 extending from the body portion 207. The electrical terminal 208 is coupled to the electrical interconnect member 128 and the electrical terminal 209 is coupled to the electrical interconnect member 140.

Referring to FIG. 1, the housing 70 is configured to hold the battery cells 20-58 therein, and to hold the battery cell interconnect and voltage sensing assembly 90 thereon.

Figure 4:
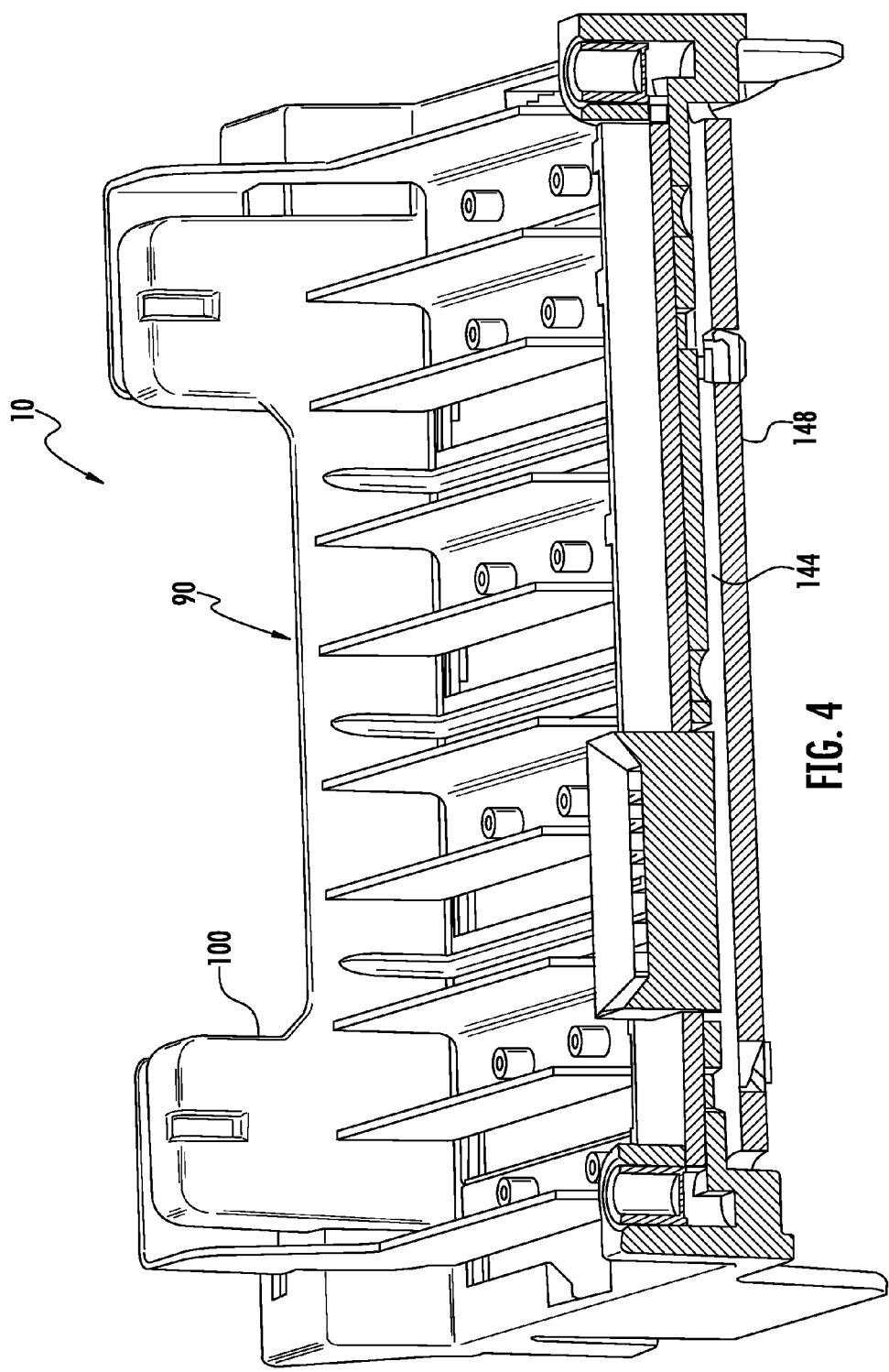
FIG. 4 is a cross-sectional schematic of the battery cell interconnect and voltage sensing assembly of FIGS. 1
Figure 5:
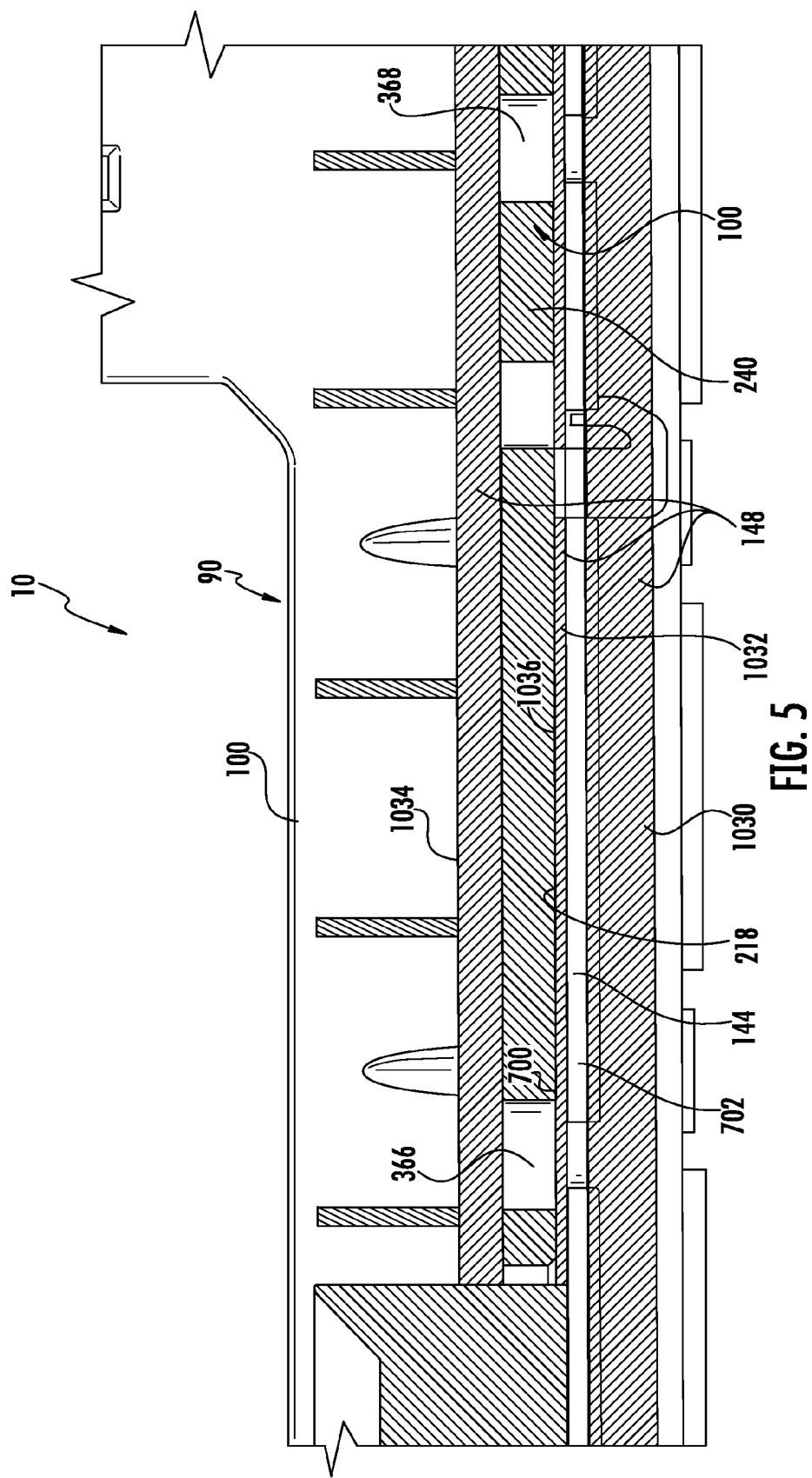
FIG. 5 is an enlarged cross-sectional schematic of a portion of the battery cell interconnect and voltage sensing assembly of FIG. 1.
Figure 15:
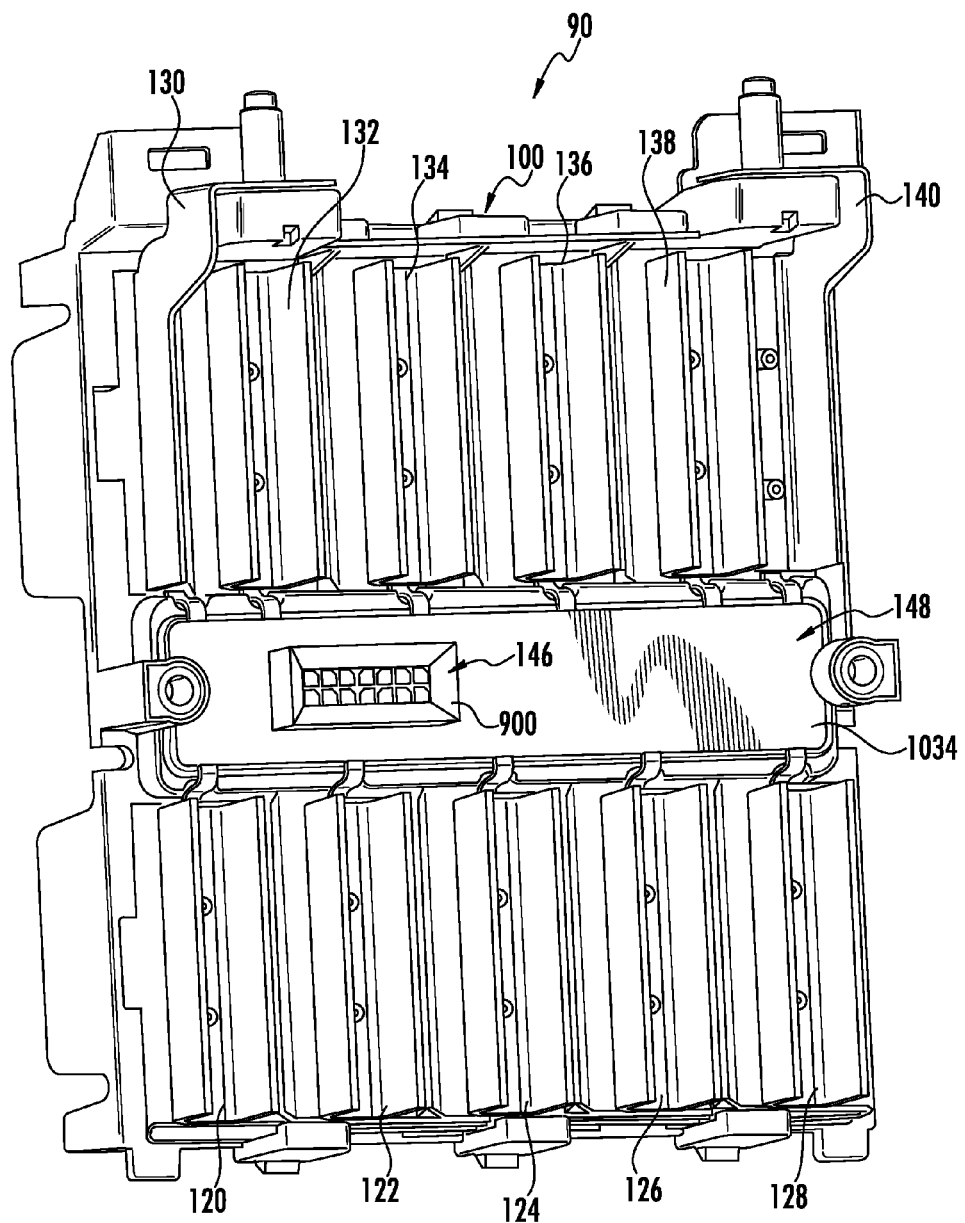
FIG. 15 is a schematic of the battery cell interconnect and voltage sensing assembly of FIG. 1 having a frame member, electrical interconnect members; and a circuit board encapsulated within an encapsulation layer, in accordance with an exemplary embodiment.
Figure 16:
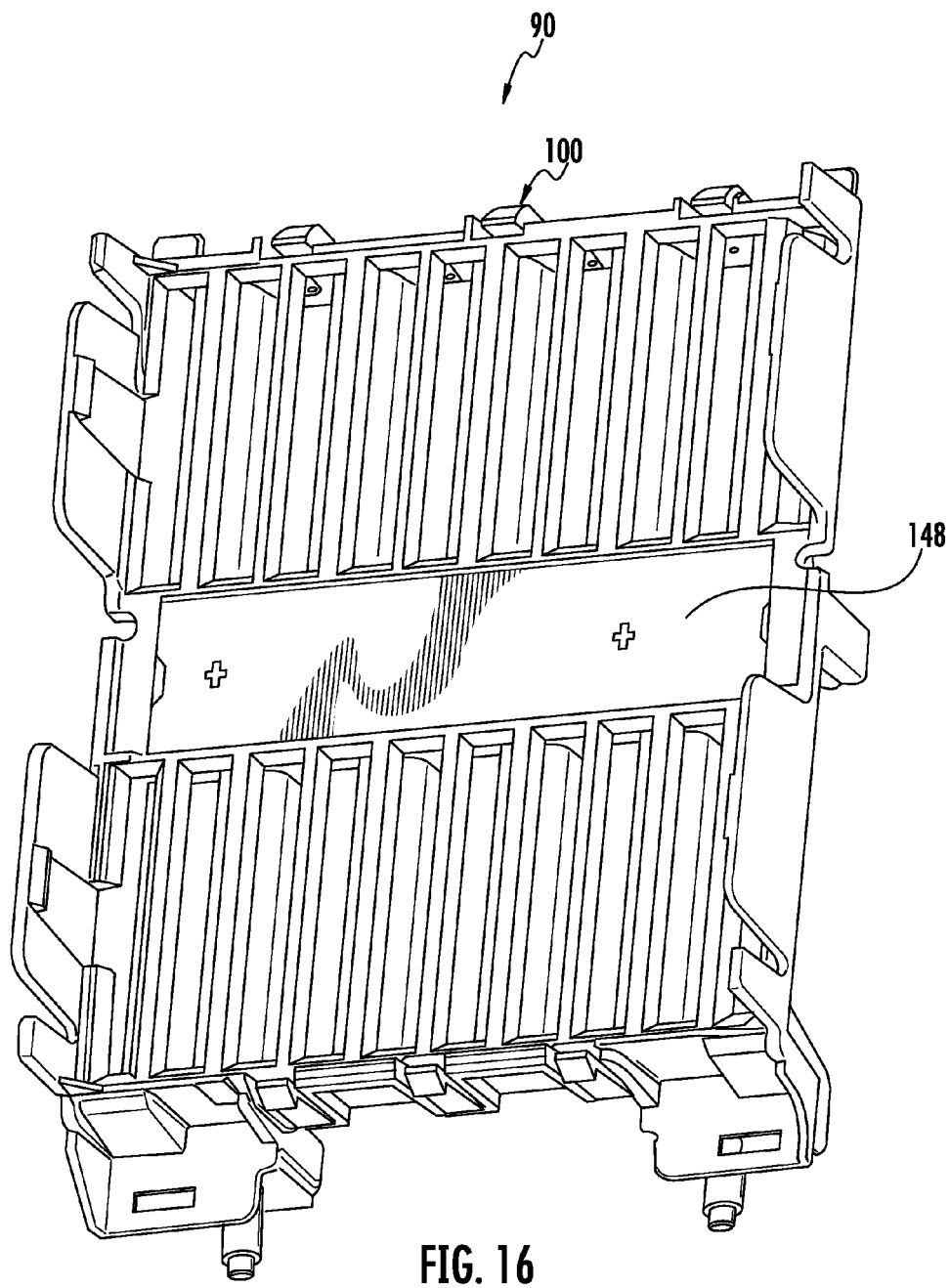
FIG. 16 is another schematic of the battery cell interconnect and voltage sensing assembly of FIG. 1 having a frame member, electrical interconnect members; and a circuit board encapsulated within an encapsulation layer, in accordance with an exemplary embodiment.

Referring to FIGS. 4, 5 and 15, the battery cell interconnect and voltage sensing assembly 90 is configured to electrically couple the battery cells 20-58 in series with one another. Further, the assembly 90 has an electrical connector 146 electrically coupled to the electrical interconnect members. A computer or microprocessor (not shown) can be operably coupled to the electrical connector 146 to measure operational voltages of the battery cells 20-58 and to store values corresponding to operational voltages in a memory device.

The assembly 90 includes a frame member 100, electrical interconnect members 120, 122, 124, 126, 128, 130, 132, 134, 136, 138, 140, a circuit board 144, an electrical connector 146, and an electrical encapsulation portion 148.

Figure 6:
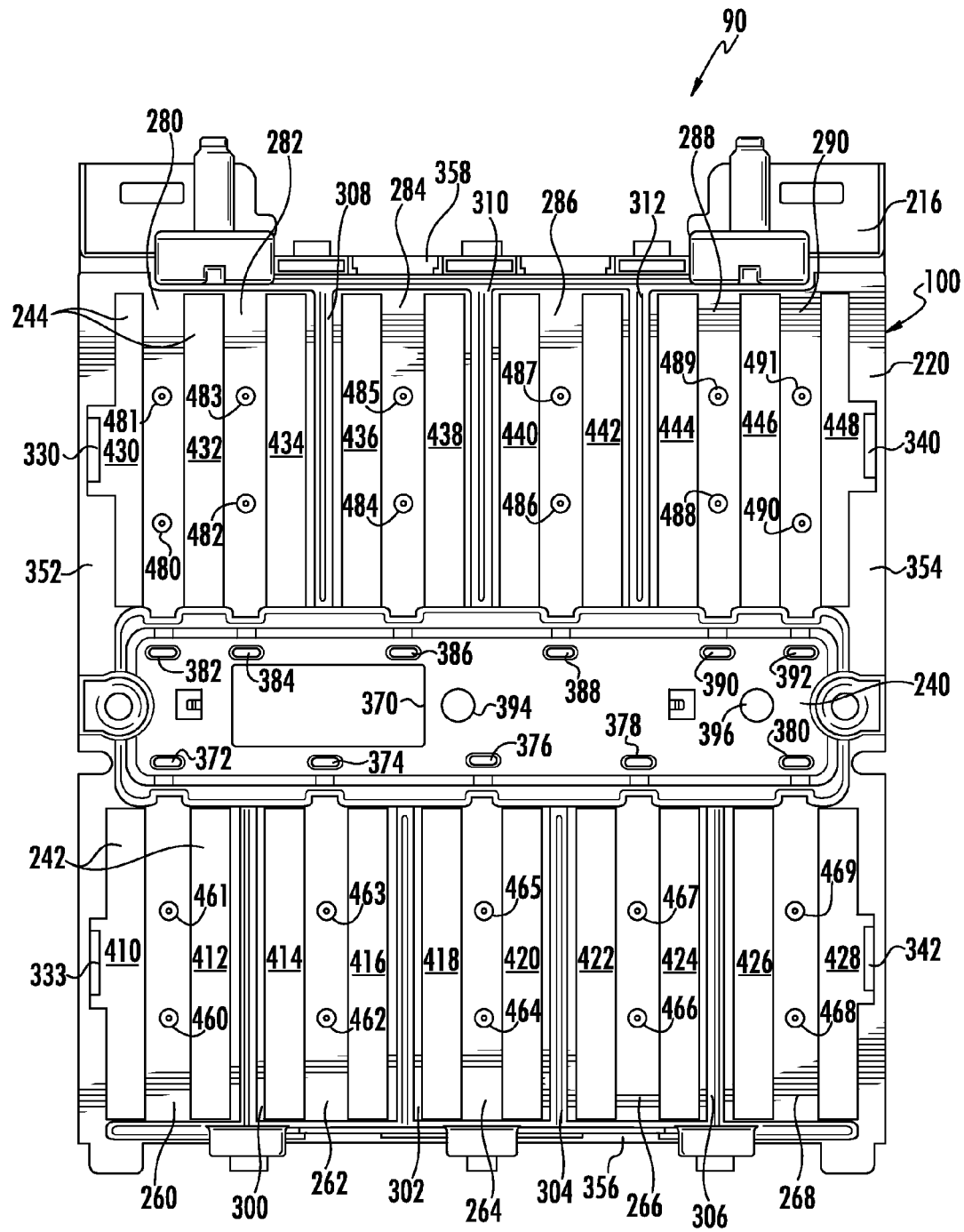
FIG. 6 is a schematic of a first side of a frame member utilized in the battery cell interconnect and voltage sensing assembly of FIG. 1.
Figure 7:
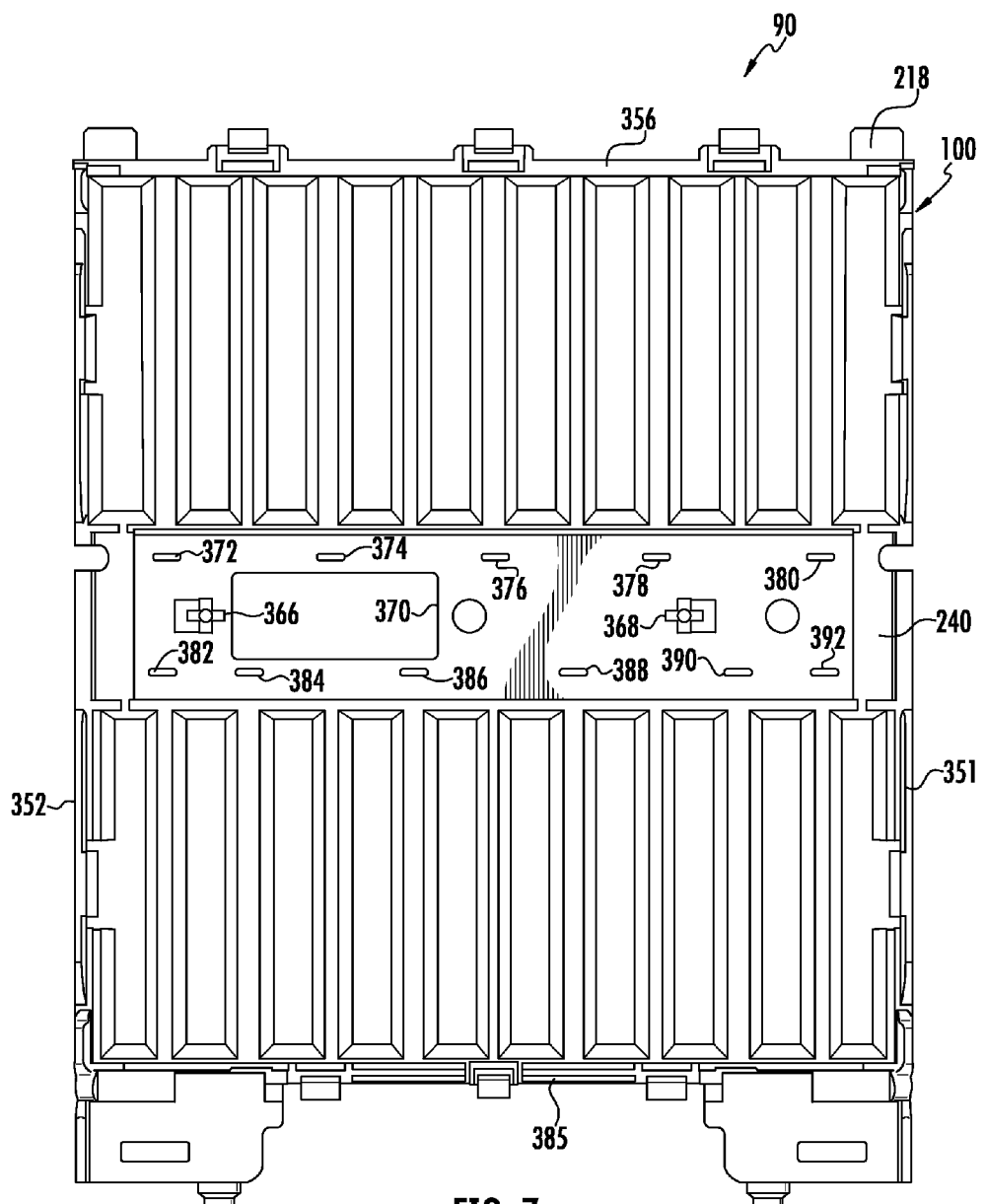
FIG. 7 is a schematic of a second side of the frame member utilized in the battery cell interconnect and voltage sensing assembly of FIG. 1.
Figure 8:
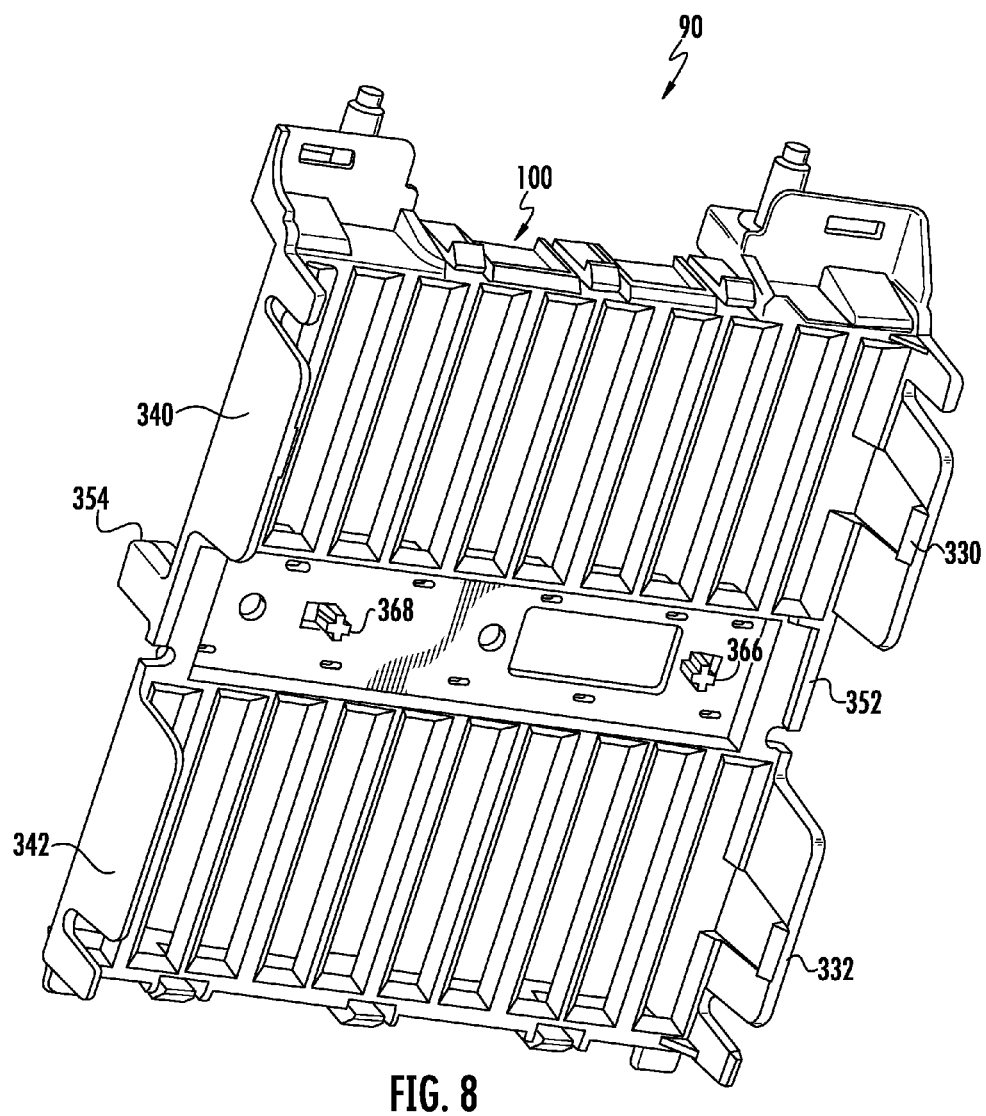
FIG. 8 is a schematic of the frame member utilized in the battery cell interconnect and voltage sensing assembly of FIG. 1.

The frame member 100 is configured to support the electrical interconnect members 120-140, the circuit board 144, the electrical connector 146, and the encapsulation portion 148. Referring to FIGS. 6-8, the frame member 100 has a first side 216 and a second side 218. The frame member 100 further includes a generally rectangular ring-shaped peripheral wall 220, a central plate portion 240, support members 260, 262, 264, 277, 268, 280, 282, 286, 288, 290, crossmembers 300, 302, 304, 306, 308, 310, 312, and mounting tabs 330, 332, 340, 342. In one exemplary embodiment, the frame member 100 is constructed of plastic.

The generally rectangular ring-shaped peripheral wall 220 has first, second, third and fourth wall portions 352, 354, 356, 358. The first and second wall portions 352, 354 are substantially parallel to one another and are spaced apart from one another. The third and fourth wall portions 356, 358 are substantially parallel to one another and are spaced apart from one another.

Referring to FIGS. 4, 5, 11 and 15, the central plate portion 240 is coupled between the first and second wall portions 352, 354. The central plate portion 240 defines a first space 242 between the central plate portion 240 and the third wall portion 356. The central plate portion 240 further defines a second space 244 between the central plate portion 240 and the fourth wall portion 358. The central plate portion 240 includes coupling tabs 366, 368 that extend outwardly from the second side 218. The coupling tabs 366, 368 are configured to be received in corresponding apertures of the circuit board 144 and to hold the citcuit board 144 a predetermined distance from the second side 218 such that an encapsulation portion 148 completely surrounds the circuit board 144. The central plate portion 240 further includes apertures 370, 372, 374, 376, 378, 380, 382, 384, 386, 388, 390, 392, 394, 396 extending therethrough for receiving corresponding voltage sensing tabs from the electrical interconnect members therethrough.

The support members 260, 262, 264, 266, 268 and cross members 300, 302, 304, and 306 are disposed between the third wall portion 356 and the central plate portion 240. Gaps 410, 412 are formed adjacent to opposite edges of the support member 260; and gaps 414, 416 are formed adjacent to opposite edges of the support member 262. Gaps 414, 416 are formed adjacent to opposite edges of the support member 262; and gaps 418, 420 are formed adjacent to opposite edges of the support member 264. Gaps 422, 424 are formed adjacent to opposite edges of the support member 266; and gaps 426, 428 are formed adjacent to opposite edges of the support member 268.

The support members 280, 282, 286, 288, 290 and cross members 308, 310, 312 are disposed between the fourth wall portion 358 and the central plate portion 240. Gaps 430, 432 are formed adjacent to opposite edges of the support member 280; and gaps 432, 434 are formed adjacent to opposite edges of the support member 282. Gaps 436, 438 are formed adjacent to opposite edges of the support member 284; and gaps 440, 442 are formed adjacent to opposite edges of the support member 286. Gaps 444, 446 are formed adjacent to opposite edges of the support member 288; and gaps 446, 448 are formed adjacent to opposite edges of the support member 290.

Referring to FIGS. 6 and 15, the support member 260 includes attachment members 460, 461 extending therefrom for coupling the electrical interconnect member 120 to the support member 260; and the support member 262 includes attachment members 462, 463 extending therefrom for coupling the electrical interconnect member 122 to the support member 262.

The support member 264 includes attachment members 464, 465 extending therefrom for coupling the electrical interconnect member 124 to the support member 264; and the support member 266 includes attachment members 466, 467 extending therefrom for coupling the electrical interconnect member 126 to the support member 266.

The support member 268 includes attachment members 468, 469 extending therefrom for coupling the electrical interconnect member 128 to the support member 268.

The support member 280 includes attachment members 480, 481 extending therefrom for coupling the electrical interconnect member 130 to the support member 280; and the support member 282 includes attachment members 482, 483 extending therefrom for coupling the electrical interconnect member 132 to the support member 282.

The support member 284 includes attachment members 484, 485 extending therefrom for coupling the electrical interconnect member 134 to the support member 284; and the support member 286 includes attachment members 486, 487 extending therefrom for coupling the electrical interconnect member 136 to the support member 286.

The support member 288 includes attachment members 488, 489 extending therefrom for coupling the electrical interconnect member 138 to the support member 288; and the support member 290 includes attachment members 490, 492 extending therefrom for coupling the electrical interconnect member 140 to the support member 290.

Referring to FIGS. 1 and 8, the mounting tabs 330, 332 extend from the first wall portion 352 and are configured to removably engage the housing 70. Also, the mounting tabs 340, 342 extend from the second wall portion 354 and are configured to removably engage the housing 70.

Figure 9:
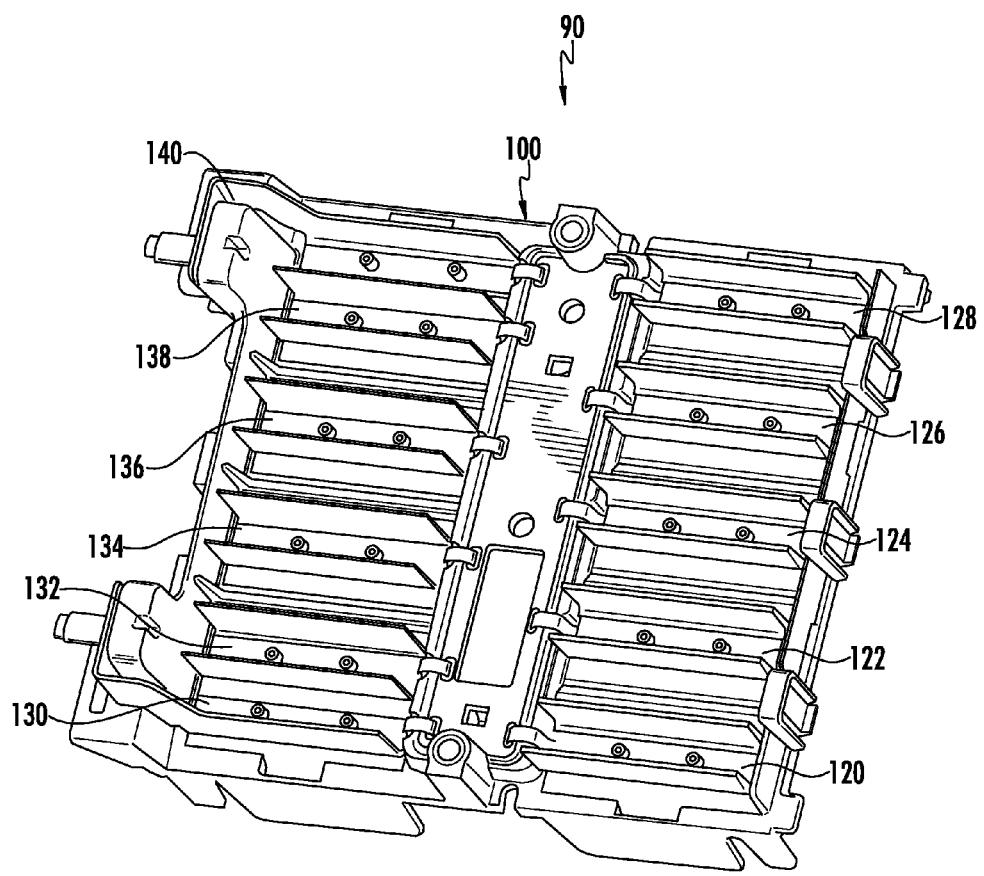
FIG. 9 is a schematic of a frame member having electrical interconnect members coupled thereto, that are utilized in the battery cell interconnect and voltage sensing assembly of FIG. 1.
Figure 10:
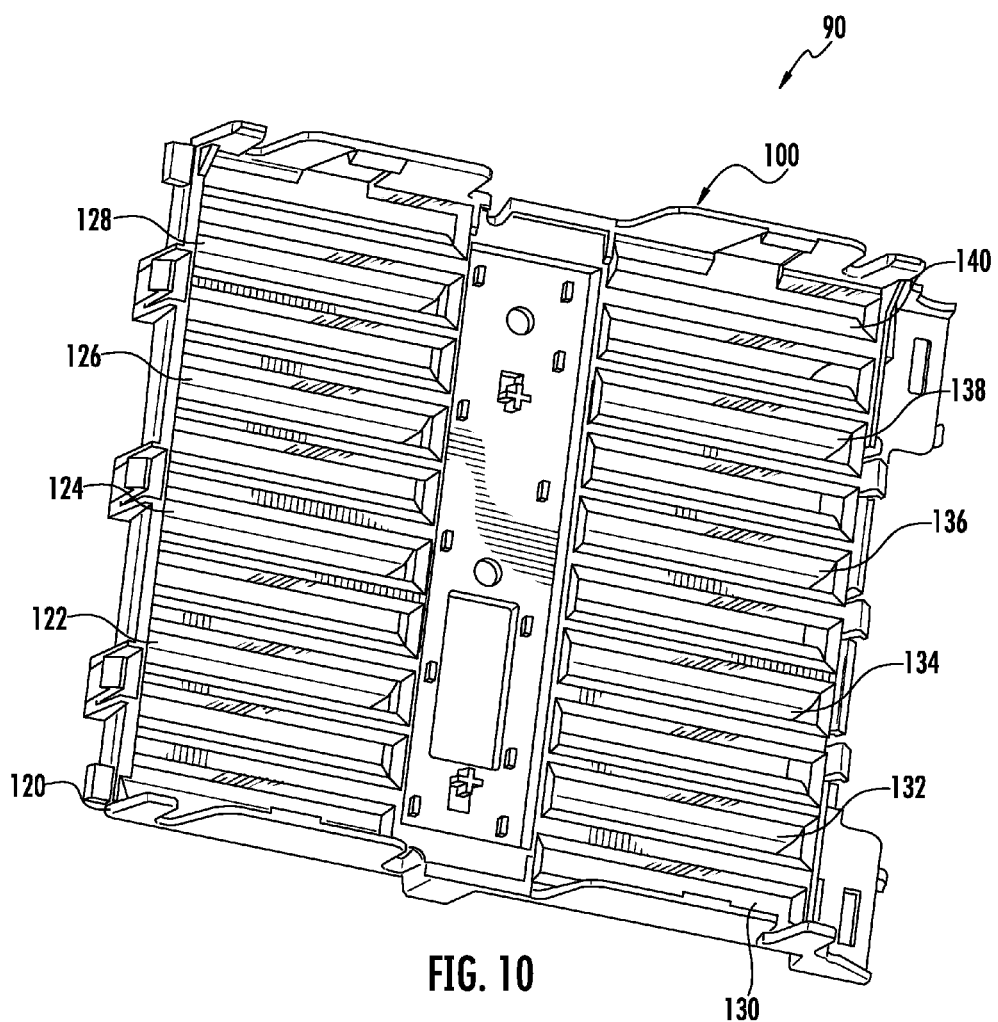
FIG. 10 is another schematic of a frame member having electrical interconnect members coupled thereto, that are utilized in the battery cell interconnect and voltage sensing assembly of FIG. 1.
Figure 11:
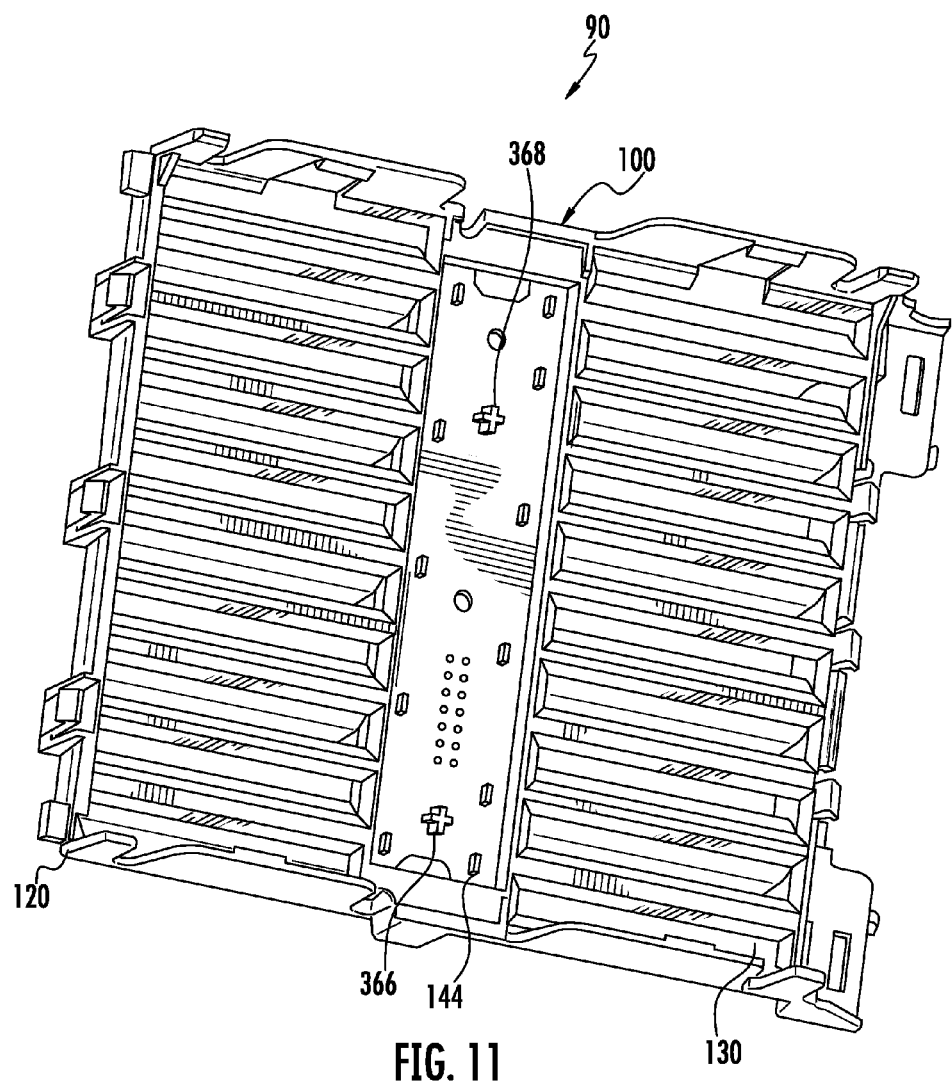
FIG. 11 is a schematic of a frame member having electrical interconnect members and a circuit board coupled thereto, that are utilized in the battery cell interconnect and voltage sensing assembly of FIG. 1.
Figure 12:
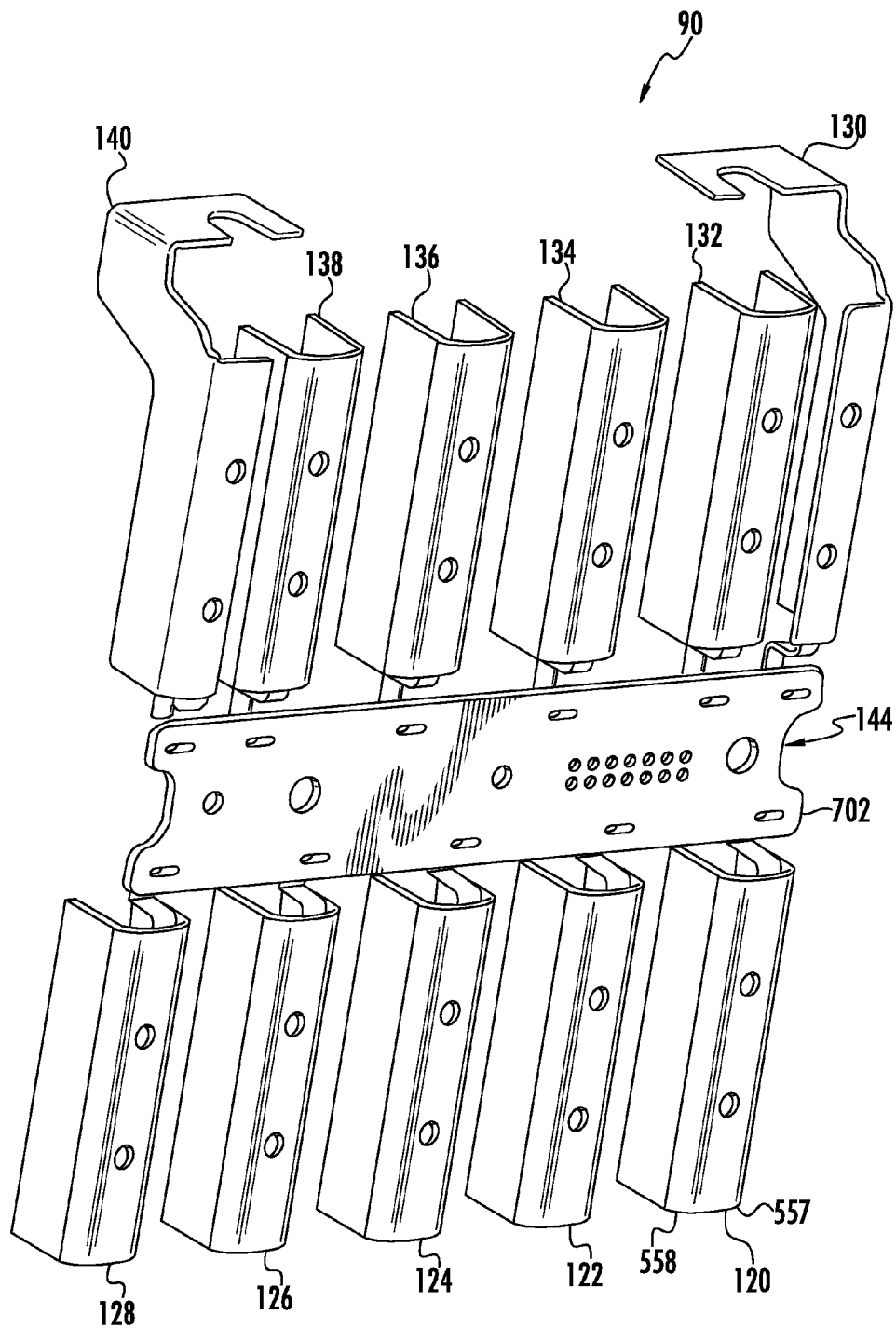
FIG. 12 is a schematic of the circuit board of FIG. 11 coupled to the electrical interconnect members.
Figure 13:
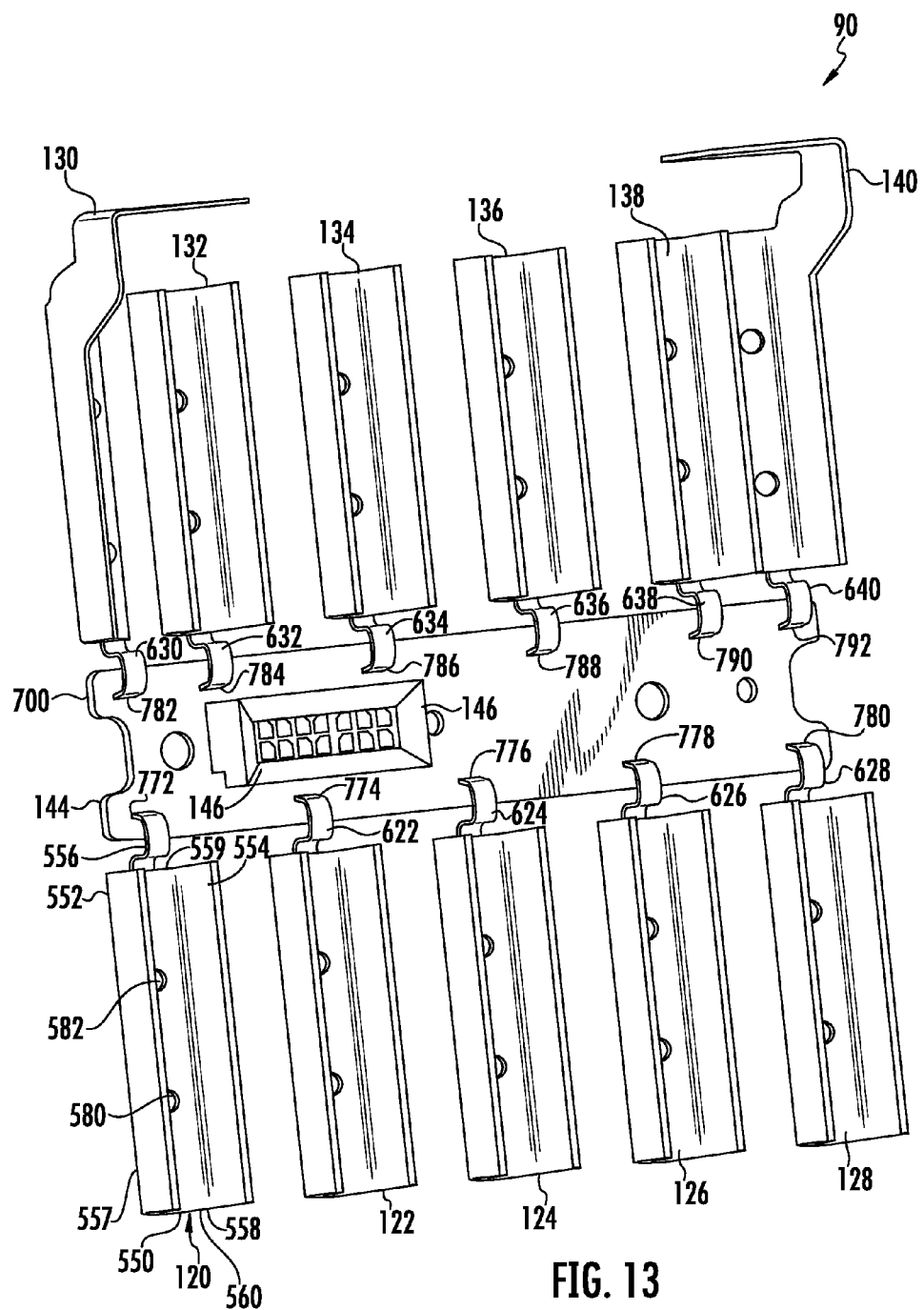
FIG. 13 is another schematic of the circuit board of FIG. 11 coupled to the electrical interconnect members.

Referring to FIGS. 9, 12 and 13, the electrical interconnect members 120, 122, 124, 126, 128, 130, 132, 134, 136, 138, 140 are provided to electrically couple the battery cells 20-58 in series with one another. The structure of the electrical interconnect members 120, 122, 124, 126, 128, 132, 134, 136, 138 have an identical structure so only the structure of the electrical interconnect member 120 will be discussed in greater detail below. The electrical interconnect member 120 includes a rectangular plate 550, side walls 552, 554, and a voltage sensing tab 556. The rectangular plate 550 has edges 557, 558 disposed substantially parallel to one another; and edges 559, 560 disposed substantially parallel to one another. The side walls 552, 554 extend from the edges 557, 558, respectively outwardly for the rectangular plate 550 in a first direction. The tab 556 extends outwardly from the edge 559.

Referring to FIGS. 6 and 13, the electrical interconnect member 120 has the rectangular plate 550 with apertures 580, 582 extending therethrough. The support member 260 has the attachment tabs 460, 461 that are configured to extend through the apertures 580, 582, respectively, of the rectangular plate 550. Thereafter, the attachment tabs 460, 461 are heat-staked to fixedly hold the electrical interconnect member 120 on the support member 260. The other electrical interconect members are coupled to respective support members on the frame member 100 utilizing a method identical to that described for the electrical interconnect member 120.

As shown, the electrical inconnect members 120, 122, 124, 126, 128, 130, 132, 134, 136, 138, 140 includes voltage sensing tabs 556, 622, 624, 626, 628, 630, 632, 634, 636, 638, 640, respectively. In one exemplary embodiment, the electrical interconnect members 120, 122, 124, 126, 128, 130, 132, 134, 136, 138, 140 are constructed from copper or nickel-plated copper. However, in alternative embodiments, the other electrically conducting materials can be used to construct the electrical interconnect members 120-140. Each of the electrical interconnect members 120-140 are configured to be coupled between electrical terminals from a first battery cell and another battery cell for routing electrical current from the first battery cell to the another battery cell. It should be noted that the number of electrical interconnect members can vary based on upon a desired number of battery cells.

Referring to FIGS. 7 and 13-15, the circuit board 144 is configured to electrically couple the electrical interconnect members 120-140 to the electrical connector 146. A computer (not shown) can be electrically coupled to the electrical connector 146 to measure the operational voltage levels of the battery cells and to store values indicating the operational voltage levels in a memory device.

In one exemplary embodiment, the circuit board 144 is a printed circuit board. The circuit board 144 has a first side 700 and a second side 702. The first side 700 of the circuit board 144 is disposed proximate to the central plate portion 240 on the second side 218 of the frame member. The circuit board 144 includes apertures 772, 774, 776, 778, 780, 782, 784, 786, 788, 790, 792 extending therethrough. The circuit board 144 further includes electrical traces 872, 874, 876, 878, 880, 882, 884, 886, 888, 890, 892 disposed on the second side 702 thereon.

Referring to FIGS. 6 and 13-15, the electrical connector 146 includes a housing 900 and electrical terminals 972, 974, 976, 978, 980, 982, 984, 986, 988, 990, 992 disposed therein. The electrical connector 146 is disposed on the central plate portion 240 of the frame member 100 and a portion of the housing 900 extends through the aperture 370 of the central plate portion 240.

Figure 14:
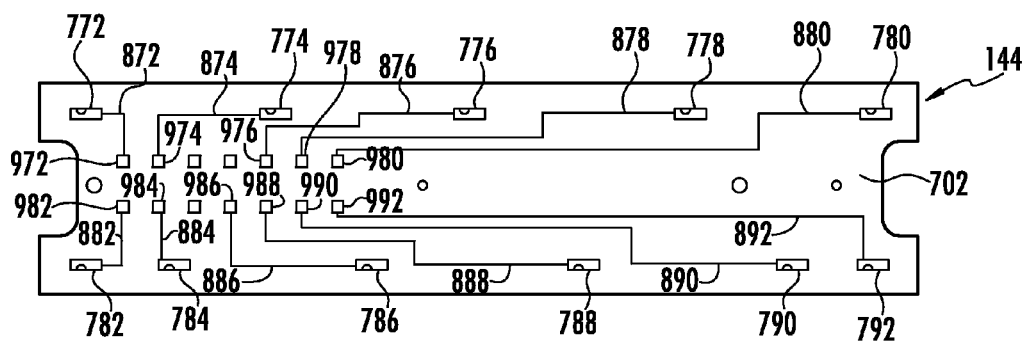
FIG. 14 is a schematic of a side of the circuit board of FIG. 11.

Referring to FIGS. 6, 13 and 14, the electrical interconnect member 120 has the tab 556 which extends through the aperture 372 of the frame member 100 and the aperture 772 of the circuit board 144. The tab 556 is soldered to the electrical trace 872 which extends to the electrical terminal 972. Thus, a computer (not shown) can monitor the electrical terminal 972 to determine an operational voltage associated with the electrical interconnect member 120 and the battery cells coupled to the member 120.

The electrical interconnect member 122 has the tab 622 which extends through the aperture 374 of the frame member 100 and the aperture 774 of the circuit board 144. The tab 622 is soldered to the electrical trace 874 which extends to the electrical terminal 974. Thus, a computer (not shown) can monitor the electrical terminal 974 to determine an operational voltage associated with the electrical interconnect member 122 and the battery cells coupled to the member 122.

The electrical interconnect member 124 has the tab 624 which extends through the aperture 376 of the frame member 100 and the aperture 776 of the circuit board 144. The tab 624 is soldered to the electrical trace 876 which extends to the electrical terminal 976. Thus, a computer (not shown) can monitor the electrical terminal 976 to determine an operational voltage associated with the electrical interconnect member 124 and the battery cells coupled to the member 124.

The electrical interconnect member 126 has the tab 626 which extends through the aperture 378 of the frame member 100 and the aperture 778 of the circuit board 144. The tab 626 is soldered to the electrical trace 878 which extends to the electrical terminal 978. Thus, a computer (not shown) can monitor the electrical terminal 978 to determine an operational voltage associated with the electrical interconnect member 126 and the battery cells coupled to the member 126.

The electrical interconnect member 128 has the tab 628 which extends through the aperture 380 of the frame member 100 and the aperture 780 of the circuit board 144. The tab 628 is soldered to the electrical trace 880 which extends to the electrical terminal 980. Thus, a computer (not shown) can monitor the electrical terminal 980 to determine an operational voltage associated with the electrical interconnect member 128 and the battery cells coupled to the member 128.

The electrical interconnect member 130 has the tab 630 which extends through the aperture 382 of the frame member 100 and the aperture 782 of the circuit board 144. The tab 630 is soldered to the electrical trace 882 which extends to the electrical terminal 982. Thus, a computer (not shown) can monitor the electrical terminal 982 to determine an operational voltage associated with the electrical interconnect member 130 and the battery cells coupled to the member 130.

The electrical interconnect member 132 has the tab 632 which extends through the aperture 384 of the frame member 100 and the aperture 784 of the circuit board 144. The tab 632 is soldered to the electrical trace 884 which extends to the electrical terminal 984. Thus, a computer (not shown) can monitor the electrical terminal 984 to determine an operational voltage associated with the electrical interconnect member 132 and the battery cells coupled to the member 132.

The electrical interconnect member 134 has the tab 634 which extends through the aperture 386 of the frame member 100 and the aperture 786 of the circuit board 144. The tab 634 is soldered to the electrical trace 886 which extends to the electrical terminal 986. Thus, a computer (not shown) can monitor the electrical terminal 986 to determine an operational voltage associated with the electrical interconnect member 134 and the battery cells coupled to the member 134.

The electrical interconnect member 136 has the tab 636 which extends through the aperture 388 of the frame member 100 and the aperture 788 of the circuit board 144. The tab 636 is soldered to the electrical trace 888 which extends to the electrical terminal 986. Thus, a computer (not shown) can monitor the electrical terminal 988 to determine an operational voltage associated with the electrical interconnect member 136 and the battery cells coupled to the member 136.

The electrical interconnect member 138 has the tab 638 which extends through the aperture 390 of the frame member 100 and the aperture 790 of the circuit board 144. The tab 638 is soldered to the electrical trace 890 which extends to the electrical terminal 990. Thus, a computer (not shown) can monitor the electrical terminal 990 to determine an operational voltage associated with the electrical interconnect member 138 and the battery cells coupled to the member 138.

The electrical interconnect member 140 has the tab 640 which extends through the aperture 392 of the frame member 100 and the aperture 792 of the circuit board 144. The tab 640 is soldered to the electrical trace 892 which extends to the electrical terminal 992. Thus, a computer (not shown) can monitor the electrical terminal 992 to determine an operational voltage associated with the electrical interconnect member 140 and the battery cells coupled to the member 140.

Referring to FIGS. 4, 5, 15 and 16, the encapsulation portion 148 is provided encapsulate the circuit board 144 to prevent liquids and other debris from contacting the first and second sides 700, 702 of the circuit board 144 and the circuit components thereon. The encapsulation portion 148 includes a first portion 1030, a second portion 1032, and a third portion 1034. The first portion 1030 is bonded to and encapsulates and covers the second side 702 of the circuit board 144. The second portion 1032 is disposed in a gap 1036 between the second side 218 of the frame member 100 and the first side 700 of the circuit board 144 and is bonded to and encapsulates and covers the first side 700. The gap 1036 is formed by the coupling tabs 366, 368 which holds the circuit board 144 away from the second side 218 of the frame member 218. The third portion 1034 is bonded to the first side 216 (see FIG. 6) of the frame member 100 on the central plate portion 240 and encapsulates and covers a portion of the central plate portion 240 and encapsulates a periphery of the electrical connector 146. In one exemplary embodiment, the encapsulation portion 148 is constructed of thermoplastic polyamide. In an alternative embodiment, other encapsulating materials with desired material properties could be utilized to construct the encapsulation portion 148. For example, in an alternative embodiment, the encapsulation portion 148 could be constructed of polymers from the following categories: thermoplastic elastomers (TPE), vulcanized thermoplastics (TPV), and room temperature vulcanizing elastomers (RTV).

Figure 17:
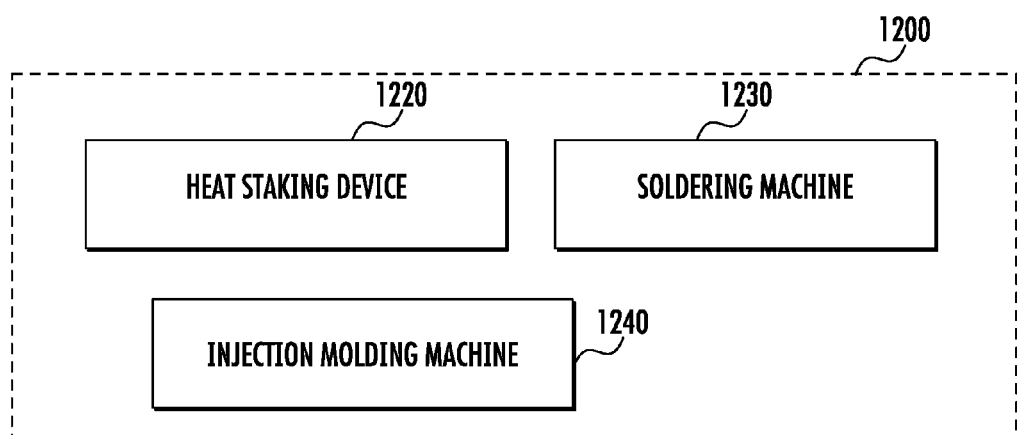
FIG. 17 is a block diagram of a system for manufacturing the battery cell interconnect and voltage sensing assembly of FIG. 15.
Figure 19:
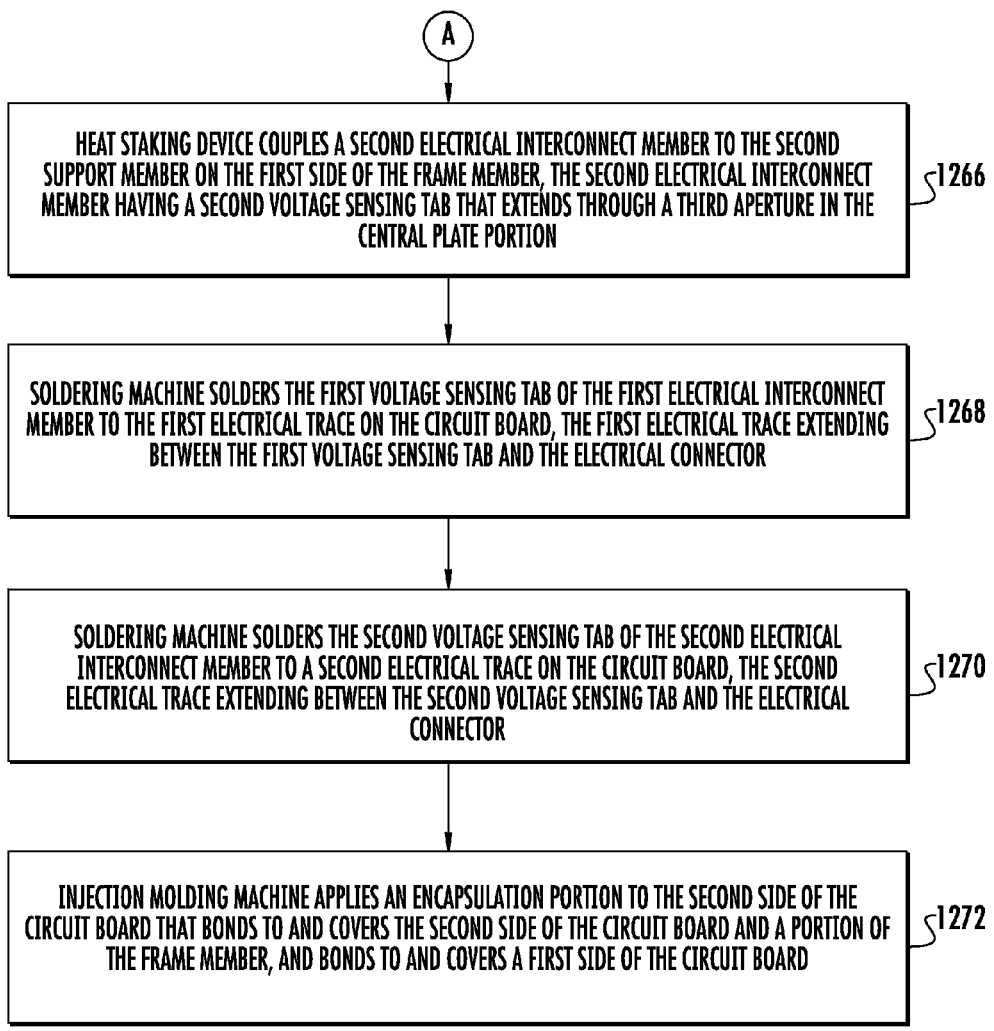
Figure 20:
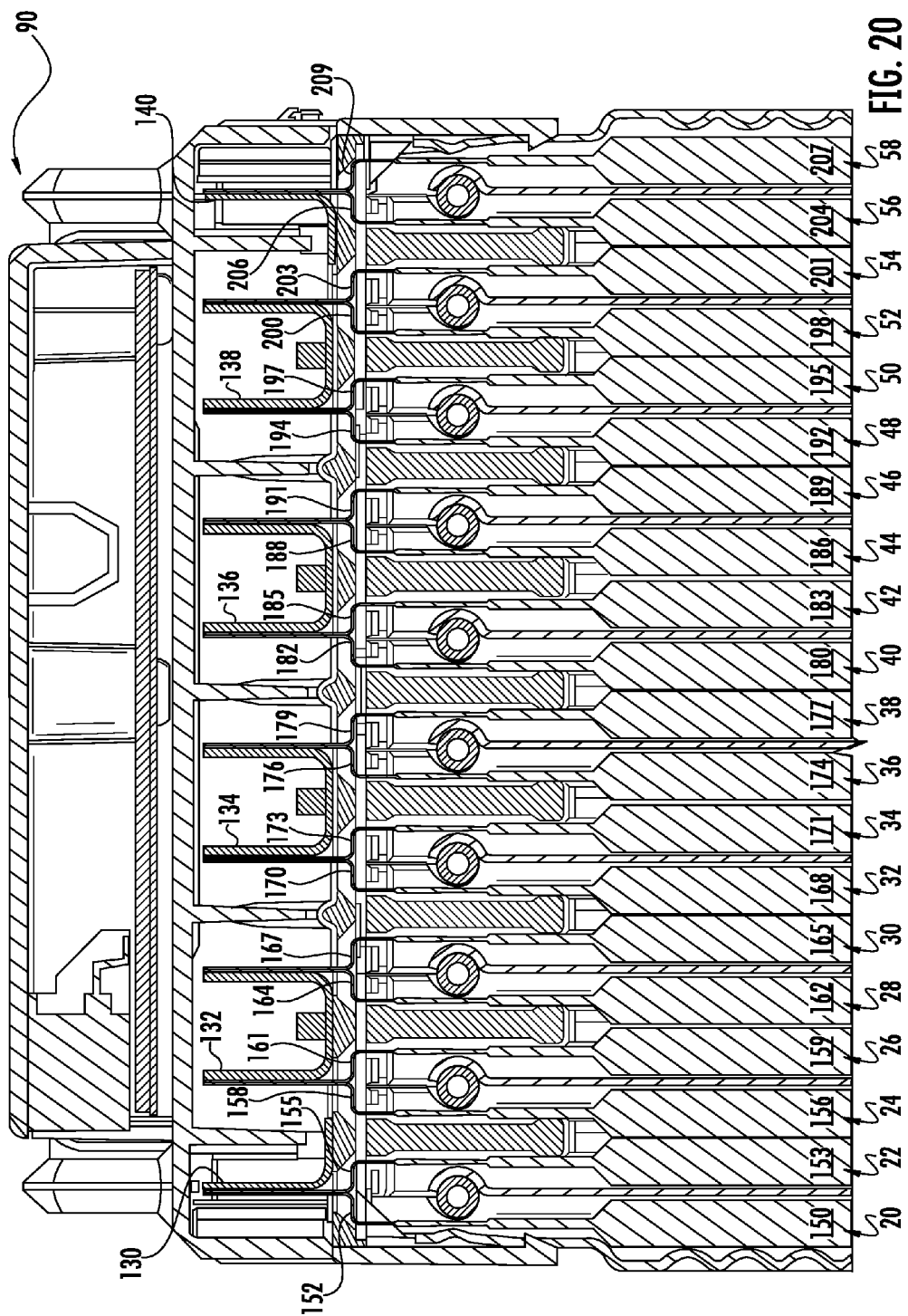
FIG. 20 is a cross-sectional schematic of a portion of the vehicle battery module of FIG. 1.

Referring to FIGS. 6, 9 and 17, a system 1200 for manufacturing the battery cell interconnect and voltage sensing assembly 90 is illustrated. The system 1200 includes a heating staking device 1220, a soldering machine 1230, and an injection molding machine 1240.

After the interconnect members 120-140 have been disposed proximate to corresponding pairs of the attachments tabs 460-489 of the frame member 100, the heat staking device 120 is configured to heat stake the attachment tabs 460-489 for coupling the electrical interconnect members 120-140 on the frame member 100.

Referring to FIGS. 13, 14 and 17, the solding machine 1230 is configured to solder the electrical traces of the circuit board 144 to the electrical terminals of the electrical connector 146.

Referring to FIGS. 4, 5, and 7, the injection molding machine 1240 is configured to form the encapsulation portion 148 to encapsulate the circuit board 144 on the frame member 100.

Referring to FIGS. 6, 9, 13, 17, 18 and 19, a method for manufacturing the battery cell interconnct and voltage sensing assembly 90 in accordance with another exemplary embodiment will be explained. For purposes of simplicity, the method will be explained utilizing only one of the electrical interconnect members, and one electrical trace on the circuit board 144. However, it will be understood that the other electrical interconnect members and other electrical traces as illustrated would also be utilized during the manufacturing method.

At step 1260, a user provides the frame member 100 having a first side 216 and a second side 218. The frame member 100 further includes a generally rectangular ring-shaped peripheral wall 220 having first, second, third and fourth wall portions 352, 354, 356, 358. The first and second wall portions 352, 354 are substantially parallel to one another and are spaced apart from one another. The third and fourth wall portions 356, 358 are substantially parallel to one another and are spaced apart from one another. The frame member 100 further includes a central plate portion 240 coupled between the first and second wall portions 352, 354. The central plate portion 240 defines a first space 242 between the central plate portion 240 and the third wall portion 356. The central plate portion 240 further defines a second space 244 between the central plate portion 240 and the fourth wall portion 358. The frame member 100 further includes a first support member 260 disposed between the third wall portion 356 and the central plate portion 240 such that first and second gaps are formed adjacent to opposite edges of the first support member 260. The frame member 100 further includes a second support member 280 disposed between the fourth wall portion 358 and the central plate portion 240 such that third and fourth gaps are formed adjacent to opposite edges of the second support member 280.

At step 1262, the user disposes the circuit board 144 proximate to the second side 218 of the frame member 100 on at least one coupling tab 366 extending from the central plate portion 240. The circuit board 144 has first and second sides 700, 702. The first side 700 of the circuit board 144 is disposed proximate to the central plate portion 240, and the second side 702 of the circuit board 144 is disposed opposite to the first side 700 of the circuit board 144. The electrical connector 146 is disposed on the circuit board 144 and extends through a first aperture 370 of the central plate portion 240. The circuit board 144 has first and second electrical traces 872, 882 thereon.

At step 1264, the heat staking device 1220 couples a first electrical interconnect member 120 to the first support member 260 on the first side 216 of the frame member 100. The first electrical interconnect member 120 has a first voltage sensing tab 556 that extends through a second aperture 772 in the central plate portion 240.

At step 1266, the heat staking device 1120 couples a second electrical interconnect member 130 to the second support member 280 on the first side 216 of the frame member 100. The second electrical interconnect member 130 has a second voltage sensing tab 630 that extends through a third aperture 782 in the central plate portion 240.

At step 1268, the soldering machine 1230 solders the first voltage sensing tab 556 of the first electrical interconnect member 120 to the first electrical trace 872 on the circuit board. The first electrical trace 872 extends between the first voltage sensing tab 556 and the electrical connector 146.

At step 1270, the soldering machine 1230 solders the second voltage sensing tab 630 of the second electrical interconnect member 130 to the second electrical trace 882 on the circuit board 144. The second electrical trace 882 extends between the second voltage sensing tab 630 and the electrical connector 146.

At step 1272, the injection molding machine 1240 applies the encapsulation portion 148 to the second side 702 of the circuit board 144 that bonds to and covers the second side 702 of the circuit board 144 and a portion of the frame member 100, and bonds to and covers the first side of the circuit board 144.

The battery cell interconnect and voltage sensing assembly 90 and the method of manufacturing the assembly provide a substantial advantage over other assemblies. In particular, the battery cell interconnect and voltage sensing assembly 90 and method utilize an encapsulation portion 148 that is bonded to at least one side of a circuit board to prevent liquids and other contaminants from contacting the circuit board. The encapsulation portion 148 provides a robust mechanical connection to the frame 100 by passing through apertures in the central plate portion 240. The encapsulation portion 148 also provides mechanical shock and vibration protection for the assembly 90 due to its elastomeric properties. Further, the encapsulation portion 148 further provides electrical isolation for the assembly 90 due to its dielectric properties.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A battery cell interconnect and voltage sensing assembly, comprising:
    a frame member having a first side and a second side, the frame member further having a generally rectangular ring-shaped peripheral wall having first, second, third and fourth wall portions, the first and second wall portions being substantially parallel to one another and being spaced apart from one another, the third and fourth wall portions being substantially parallel to one another and being spaced apart from one another;
    the frame member further having a central plate portion coupled between the first and second wall portions, the central plate portion defining a first space between the central plate portion and the third wall portion, the central plate portion further defining a second space between the central plate portion and the fourth wall portion;
    the frame member further having a first support member disposed between the third wall portion and the central plate portion such that first and second gaps are formed adjacent to opposite edges of the first support member, the first and second gaps extending through both the first side and the second side of the frame member;
    a first electrical interconnect member being disposed on and coupled to the first support member on the first side of the frame member, the first electrical interconnect member being configured to be electrically coupled to a first electrical terminal of a first battery cell extending through the first gap, the first electrical interconnect member having a first voltage sensing tab that extends through a first aperture in the central plate portion, the first aperture extending through both the first side and the second side of the frame member;
    a circuit board being disposed a predetermined distance away from the second side of the frame member on at least one coupling tab such that gap is formed between the circuit board and the second side of the frame member, the at least one coupling tab being couple to the second side of the frame member and extending from the central plate portion, the circuit board having first and second sides, the first side of the circuit board being disposed proximate to the central plate portion and the second side of the circuit board being disposed opposite to the first side of the circuit board;
    an electrical connector being disposed on the circuit board and extending through a second aperture of the central plate portion, the second aperture extending through both the first side and the second side of the frame member, the circuit board having a first electrical trace coupled between the first voltage sensing tab and the electrical connector; and
    an encapsulation portion having a first portion and a second portion, the first portion being bonded to and encapsulating the second side of the circuit board, the second portion being disposed in the gap formed between the circuit board and the second side of the frame member and being bonded to and encapsulating the first side of the circuit board.

2. The battery cell interconnect and voltage sensing assembly of claim 1, wherein the frame member further includes a second support member disposed between the fourth wall portion and the central plate portion such that third and fourth gaps are formed adjacent to opposite edges of the second support member.

3. The battery cell interconnect and voltage sensing assembly of claim 2, further comprising a second electrical interconnect member coupled to the second support member on the first side of the frame member, the second electrical interconnect member being configured to be electrically coupled to a second electrical terminal of the first battery cell extending through the third gap, the second electrical interconnect member being further configured to be electrically coupled to a third electrical terminal of a second battery cell extending through the fourth gap, such that the first and second electrical interconnect members electrically couple the first battery cell to the second battery cell, the second electrical interconnect member having a second voltage sensing tab that extends through a third aperture in the central plate portion.

4. The battery cell interconnect and voltage sensing assembly of claim 3, wherein the circuit board includes a second electrical trace coupled between the second voltage sensing tab and the electrical connector.

5. The battery cell interconnect and voltage sensing assembly of claim 2, wherein the first support member includes at least one attachment tab that extends through an aperture in the first electrical interconnect member.

6. The battery cell interconnect and voltage sensing assembly of claim 5, wherein the second support member includes at least one attachment tab that extends through an aperture in the second electrical interconnect member.

7. The battery cell interconnect and voltage sensing assembly of claim 1, wherein the encapsulation portion is constructed of thermoplastic polyamide.

8. A method for manufacturing a battery cell interconnect and voltage sensing assembly, comprising:

providing a frame member having a first side and a second side, the frame member further having a generally rectangular ring-shaped peripheral wall having first, second, third and fourth wall portions, the first and second wall portions being substantially parallel to one another and being spaced apart from one another, the third and fourth wall portions being substantially parallel to one another and being spaced apart from one another; the frame member further having a central plate portion coupled between the first and second wall portions, the central plate portion defining a first space between the central plate portion and the third wall portion, the central plate portion further defining a second space between the central plate portion and the fourth wall portion; the frame member further having a first support member disposed between the third wall portion and the central plate portion such that first and second gaps are formed adjacent to opposite edges of the first support member, the first and second gaps extending through both the first side and the second side of the frame member;

disposing a circuit board a predetermined distance away from the second side of the frame member on at least one coupling tab such that a gap is formed between the circuit board and the second side of the frame member, the at least one coupling tab being coupled to the second side of the frame member and extending from the central plate portion, the circuit board having first and second sides, the first side of the circuit board being disposed proximate to the central plate portion and the second side of the circuit board being disposed opposite to the first side of the circuit board, an electrical connector being disposed on the circuit board that extends through a first aperture of the central plate portion, the first aperture extending through both the first side and the second side of the frame member, the circuit board having a first electrical trace;

coupling a first electrical interconnect member to the first support member on the first side of the frame member, the first electrical interconnect member having a first voltage sensing tab that extends through a second aperture in the central plate portion, the second aperture extending through both the first side and the second side of the frame member;

soldering the first voltage sensing tab to the first electrical trace on the circuit board, the first electrical trace extending between the first voltage sensing tab and the electrical connector; and applying an encapsulation portion having first and second portions to the circuit board, the first portion being bonded to and encapsulating the second side of the circuit board, the second portion being disposed in the gap formed between the circuit board and the second side of the frame member and being bonded to and encapsulating the first side of the circuit board.

9. The method of claim 8, wherein the frame member further includes a second support member disposed between the fourth wall portion and the central plate portion such that third and fourth gaps are formed adjacent to opposite edges of the second support member.

10. The method of claim 9, further comprising coupling a second electrical interconnect member to the second support member on the first side of the frame member, the second electrical interconnect member having a second voltage sensing tab that extends through a third aperture in the central plate portion.

11. The method of claim 10, further comprising soldering the second voltage sensing tab to a second electrical trace on the circuit board, the second electrical trace extending between the second voltage sensing tab and the electrical connector.

12. The method of claim 8, wherein the encapsulation portion is constructed of thermoplastic polyamide.

13. The battery cell interconnect and voltage sensing assembly of claim 1, wherein the encapsulation portion further includes a third portion being bonded to the first side of the frame member on the central plate portion and encapsulating a periphery of the electrical connector.

* * * * *